United States Patent
Gupta et al.

(10) Patent No.: US 12,078,720 B2
(45) Date of Patent: Sep. 3, 2024

(54) SYSTEMS, METHODS, AND MEDIA FOR SINGLE PHOTON DEPTH IMAGING WITH IMPROVED PRECISION IN AMBIENT LIGHT

(71) Applicant: Wisconsin Alumni Research Foundation, Madison, WI (US)

(72) Inventors: Anant Gupta, Madison, WI (US); Atul Ingle, Madison, WI (US); Andreas Velten, Madison, WI (US); Mohit Gupta, Madison, WI (US)

(73) Assignee: WISCONSIN ALUMNI RESEARCH FOUNDATION, Madison, WI (US)

( * ) Notice: Subject to any disclaimer, the term of this patent is extended or adjusted under 35 U.S.C. 154(b) by 1210 days.

(21) Appl. No.: 16/297,320

(22) Filed: Mar. 8, 2019

(65) Prior Publication Data
US 2020/0284907 A1    Sep. 10, 2020

(51) Int. Cl.
*G01S 17/10* (2020.01)
*G01S 7/484* (2006.01)
(Continued)

(52) U.S. Cl.
CPC ............. *G01S 17/10* (2013.01); *G01S 7/484* (2013.01); *G01S 7/4868* (2013.01); *G01S 17/89* (2013.01); *H01L 31/107* (2013.01)

(58) Field of Classification Search
CPC .......... G01S 17/10; G01S 17/08; G01S 17/06; G01S 17/89; G01S 17/88; G01S 17/894;
(Continued)

(56) References Cited

U.S. PATENT DOCUMENTS 3,843,267 A    10/1974    Vital
10,063,849 B2    8/2018    Pacala
(Continued)

FOREIGN PATENT DOCUMENTS

JP    002018169384 A    1/2018

OTHER PUBLICATIONS

Coates, P. B. "Pile-up corrections in the measurement of lifetimes." Journal of Physics E: Scientific Instruments 5.2 (1972): 148. (Year: 1972).*

(Continued)

*Primary Examiner* — Luke D Ratcliffe
(74) *Attorney, Agent, or Firm* — Quarles & Brady, LLP

(57) ABSTRACT

In accordance with some embodiments, systems, methods and media for single photon depth imaging with improved precision in ambient light conditions are provided. In some embodiments, the system comprises: a light source; a single photon detector; an attenuation element configured to provide a variable intensity attenuation factor; and a processor programmed to: (a)-determine an ambient light intensity associated with a scene point; (b)-select an attenuation factor based on the ambient light intensity; (c)-estimate a depth of the scene point based on a multiplicity of photon arrival times determined using the detector during a period of time during which light incident on the detector is attenuated by the selected attenuation factor and during which the light source is configured to periodically emit a pulse of light toward the scene point; (d)-repeat (a)-(c) for each of a multiplicity of scene points.

20 Claims, 15 Drawing Sheets

(51) Int. Cl.
  *G01S 7/486*   (2020.01)
  *G01S 17/89*   (2020.01)
  *H01L 31/107*  (2006.01)

(58) Field of Classification Search
  CPC .... G01S 17/003; G01S 7/4863; G01S 7/4816;
      G01S 7/4865; G01S 7/4861; G01S 7/486;
      G01S 7/4868; G01S 17/04; G01S 7/483;
      G01S 17/18; G01S 7/4913; H01L 31/107;
            H01L 31/02027
  See application file for complete search history.

(56) References Cited

U.S. PATENT DOCUMENTS

| | | | | |
|---|---|---|---|---|
| 10,962,628 | B1* | 3/2021 | Laifenfeld | G01S 7/487 |
| 2002/0084430 | A1 | 7/2002 | Bamji | |
| 2011/0188029 | A1* | 8/2011 | Schmitt | G01S 17/95 |
| | | | | 356/28 |
| 2012/0261547 | A1 | 10/2012 | Eisele et al. | |
| 2016/0154105 | A1* | 6/2016 | Sigmund | G01V 8/20 |
| | | | | 356/5.01 |
| 2017/0176578 | A1 | 6/2017 | Rae et al. | |
| 2018/0259645 | A1 | 9/2018 | Shu | |
| 2018/0299552 | A1* | 10/2018 | Shu | G01S 7/4863 |

OTHER PUBLICATIONS

Achar, S. et al. Epipolar time-of-flight imaging. ACM Trans. Graph., 36(4):37:1-37:8, Jul. 2017.
Beer, M et al. Spad-based flash lidar sensor with high ambient light rejection for automotive applications. In Quantum Sensing and Nano Electronics and Photonics XV, vol. 10540, pp. 10540-10548, 2018.
Buttafava, M et al. Non-line-of-sight imaging using a time-gated single photon avalanche diode. Opt. Express, 23(16):20997-21011, Aug. 2015.
Buttafava, M et al. Time-gated singlephoton detection module with 110 ps transition time and up to 80 MHZ repetition rate. Review of Scientific Instruments, 85(8):083114, 2014.
Charbon, E et al. SPAD-Based Sensors, pp. 11-38. Springer Berlin Heidelberg, Berlin, Heidelberg, 2013.
Coates, P. B. "The correction for photon 'pile-up' in the measurement of radiative lifetimes." Journal of Physics E: Scientific Instruments 1.8 (1968): 878.
Dautet, H et al. Photon counting techniques with silicon avalanche photodiodes. Appl. Opt., 32(21):3894-3900, Jul. 1993.
Degnan J. Impact of receiver deadtime on photon-counting slr and altimetry during daylight operations. In 16th International Workshop On Laser Ranging, Poznan Poland, 2008.
Fouche, DG. Detection and false alarm probabilities for laser radars that use geiger-mode detectors. Applied Optics, 42(27):5388-5398, 2003.
Gupta, M. et al. Structured light in sunlight. In 2013 IEEE International Conference on Computer Vision, pp. 545-552, Dec. 2013.
Harris CM et al. Single-photon decay spectroscopy. ii. the pile-up problem. Australian Journal of Chemistry, 32(10):2111-2129, 1979.
Heide, F et al. Sub-picosecond photon-efficient 3d imaging using single-photon sensors. Scientific Reports, 8(1), Dec. 2018.
International Searching Authority. International Search Report and Written Opinion for application PCT/US2020/020941. Mailed on Jun. 4, 2020. 11 pages.
Isbaner, S et al. Dead-time correction of fluorescence lifetime measurements and fluorescence lifetime imaging. Optics express, 24(9):9429-9445, 2016.
Kirmani, A et al. First-photon imaging. Science, 343(6166):58-61, 2014.
Lindell, DB et al. Single-Photon 3D Imaging with Deep Sensor Fusion. ACM Trans. Graph. (SIGGRAPH), 37(4), 2018.
Mertz, C et al. A low-power structured light sensor for outdoor scene reconstruction and dominant material identification. In Computer Vision and Pattern Recognition Workshops (CVPRW), 2012 IEEE Computer Society Conference on, pp. 15-22. IEEE, 2012.
Nature Publishing Group. Lidar drives forwards. Nature Photonics, 12(8):441, Jul. 2018.
O'Toole, M et al. Confocal non-line-of-sight imaging based on the light-cone transform. Nature, 555:338-341, Mar. 2018.
O'Toole, M et al. Homogeneous codes for energy-efficient illumination and imaging. ACM Trans. Graph., 34(4):35:1-35:13, Jul. 2015.
O'Toole, M et al. Reconstructing transient images from singlephoton sensors. In 2017 IEEE Conference on Computer Vision and Pattern Recognition (CVPR), pp. 2289-2297, Jul. 2017.
Patting, M et al. Fluorescence decay data analysis correcting for detector pulse pile-up at very high count rates. Optical engineering, 57(3):031305, 2018.
Pediredla, AK et al. Signal processing based pile-up compensation for gated singlephoton avalanche diodes. arXiv preprint arXiv:1806.07437, 2018.
Perenzoni, M et al. A 64x64-pixels digital silicon photomultiplier direct tof sensor with 100-MPhotons/s/pixel background rejection and imaging/altimeter mode with 0.14% precision up to 6 km for spacecraft navigation and landing. IEEE Journal of SolidState Circuits, 52:151-160, 2017.
Rapp J et al. A few photons among many: Unmixing signal and noise for photon-efficient active imaging. IEEE Transactions on Computational Imaging, 3(3):445-459, Sep. 2017.
Rapp, J et al. Dead time compensation for high-flux ranging. arXiv preprint arXiv:1810.11145, 2018.
Renker D. Geiger-mode avalanche photodiodes, history, properties and problems. Nuclear Instruments and Methods in Physics Research Section A: Accelerators, Spectrometers, Detectors and Associated Equipment, 567(1):48-56, 2006. Proceedings of the 4th International Conference on New Developments in Photodetection.
Scharstein D et al. Learning conditional random fields for stereo. In IEEE Conference on Computer Vision and Pattern Recognition, 2007, pp. 1-8, 2007.
Schwartz, DE et al. A single-photon avalanche diode array for fluorescence lifetime imaging microscopy. IEEE Journal of Solid-State Circuits, 43(11):2546-2557, Nov. 2008.
Shin, D et al. Photon-efficient computational 3-d and reflectivity imaging with single-photon detectors. IEEE Transactions on Computational Imaging, 1(2):112-125, Jun. 2015.
Silberman, N et al. Indoor segmentation and support inference from RGBD images. In ECCV, 2012.
Walker JG. Iterative correction for photon 'pile-up' in single-photon lifetime measurement. Optics Communications, 201(4-6):271-277, 2002.
Wang, L et al. Adaptive aperture for geiger mode avalanche photodiode flash ladar systems. Review of Scientific Instruments, 89(2):023105, 2018.
European Extended Search Report for corresponding application No. EP 20770679.7, mailed Mar. 6, 2023.
Supplementary Partial EP Search Report issued in corresponding EP Application No. 20 77 0679, issued Oct. 27, 2022.

* cited by examiner

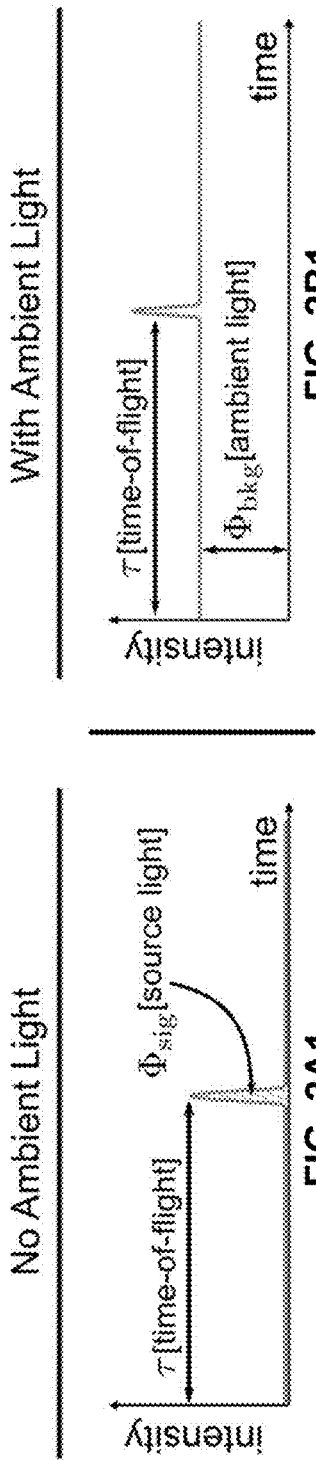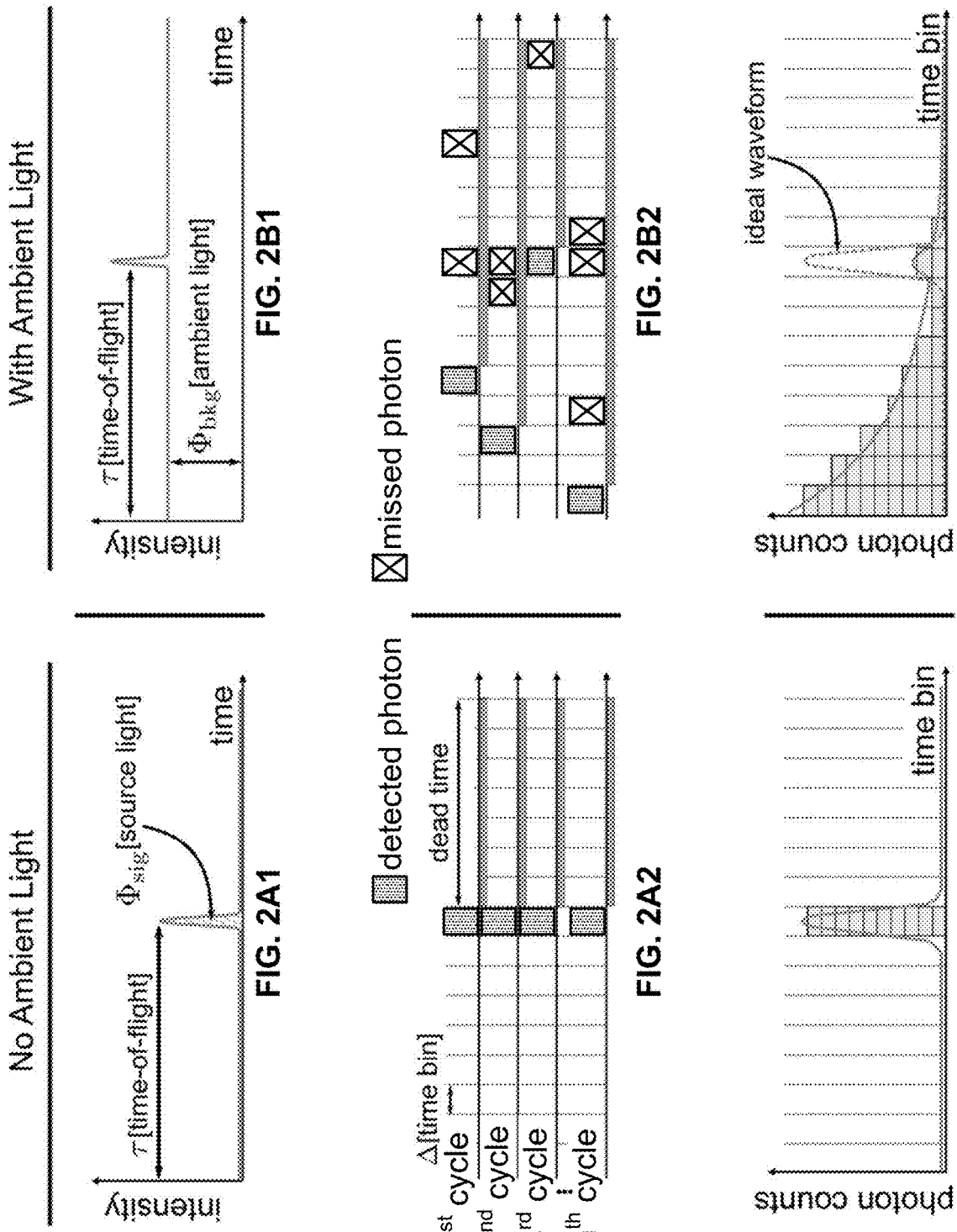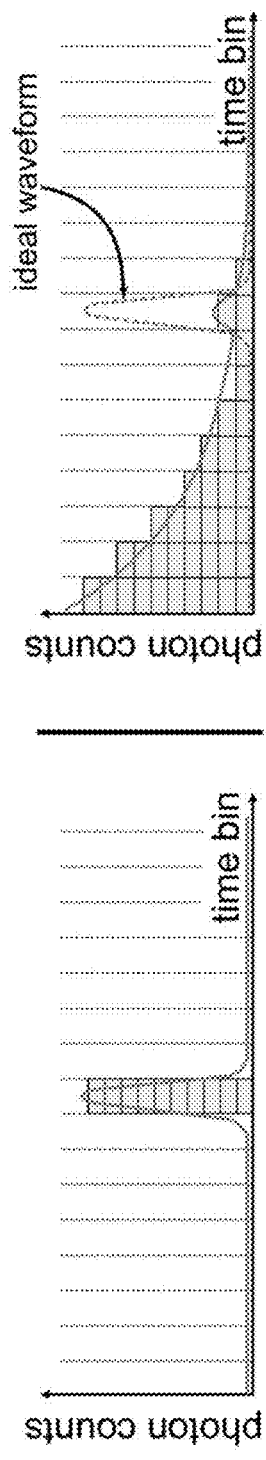
FIG. 2A1  FIG. 2B1
FIG. 2A2  FIG. 2B2
FIG. 2A3  FIG. 2B3

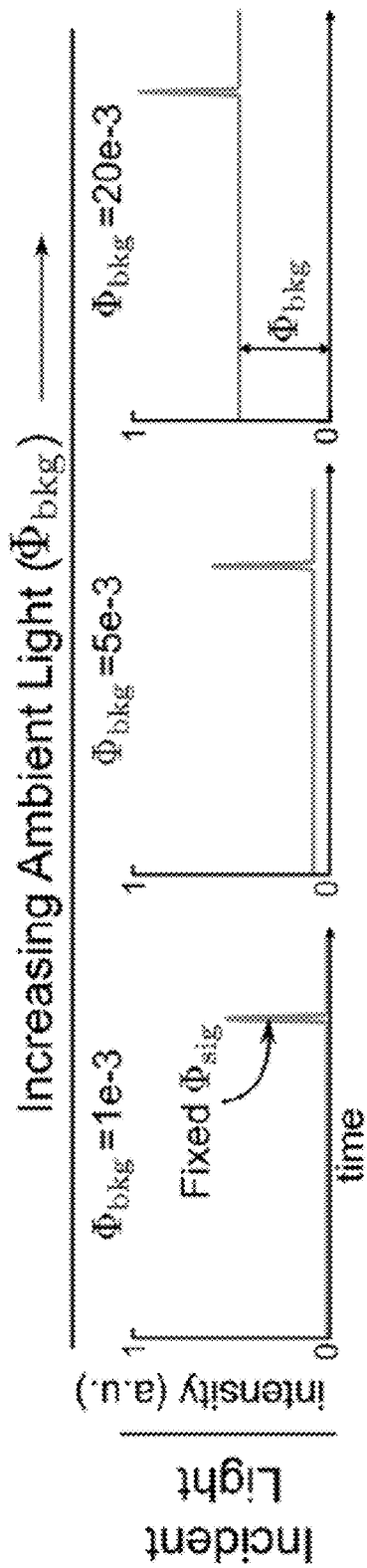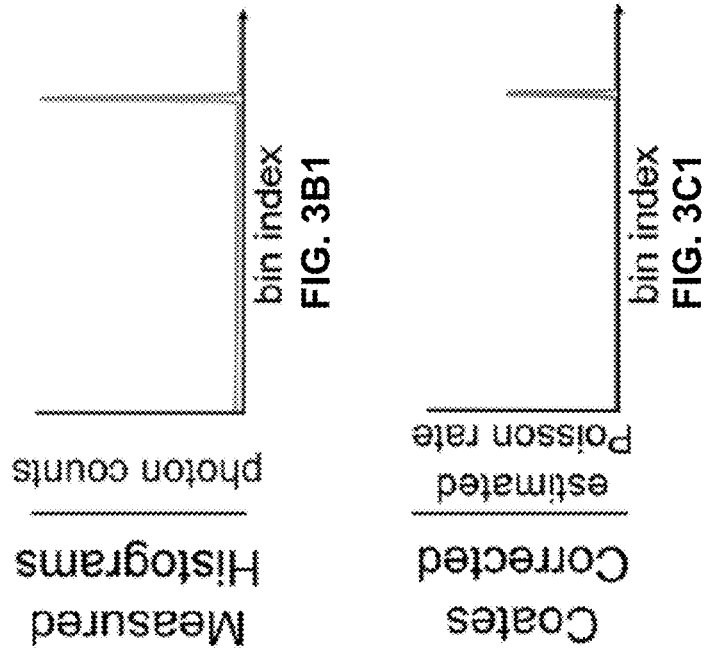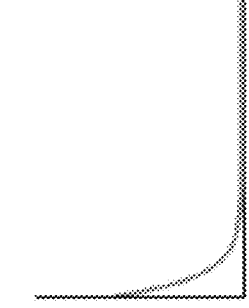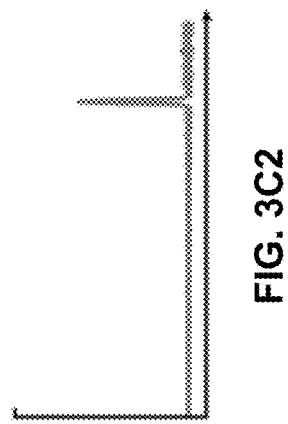

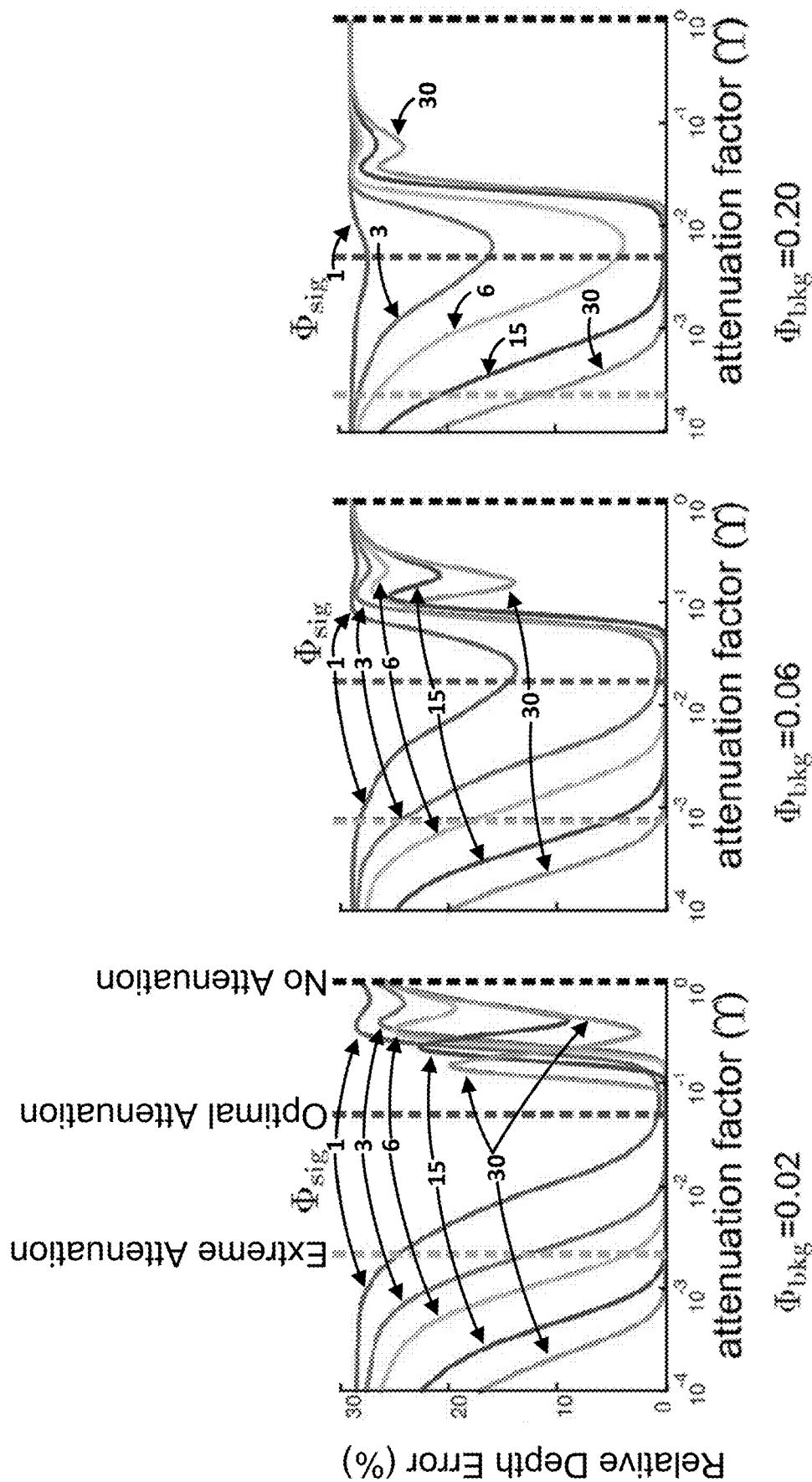
FIG. 7A1  FIG. 7A2  FIG. 7A3

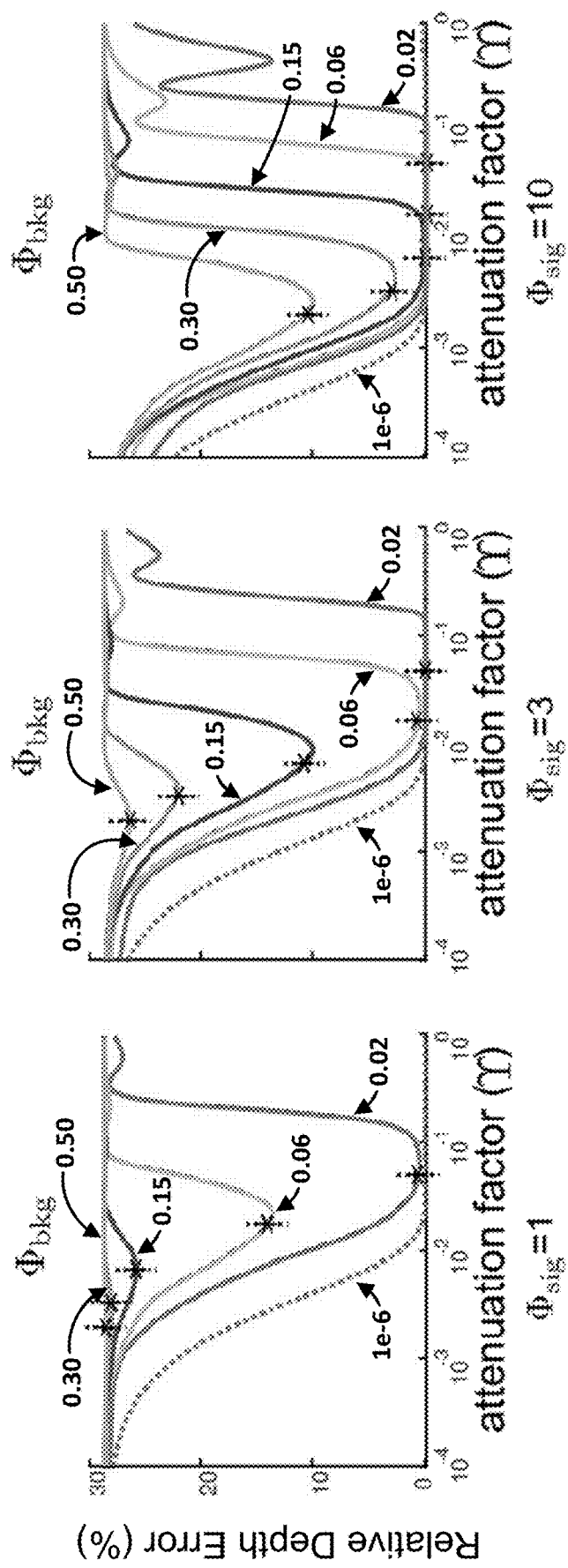
FIG. 7B3
FIG. 7B2
FIG. 7B1

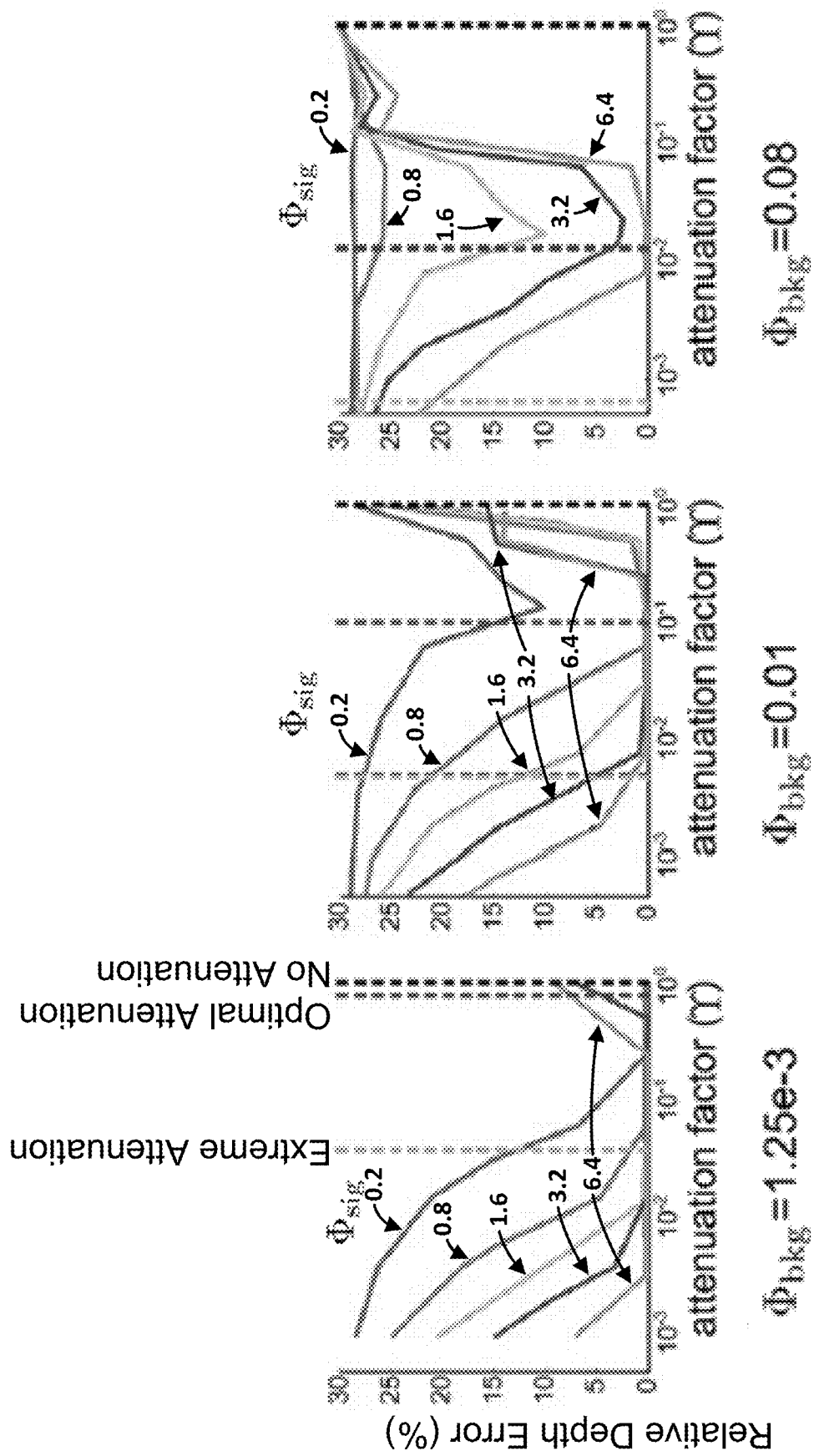
FIG. 9A3
FIG. 9A2
FIG. 9A1

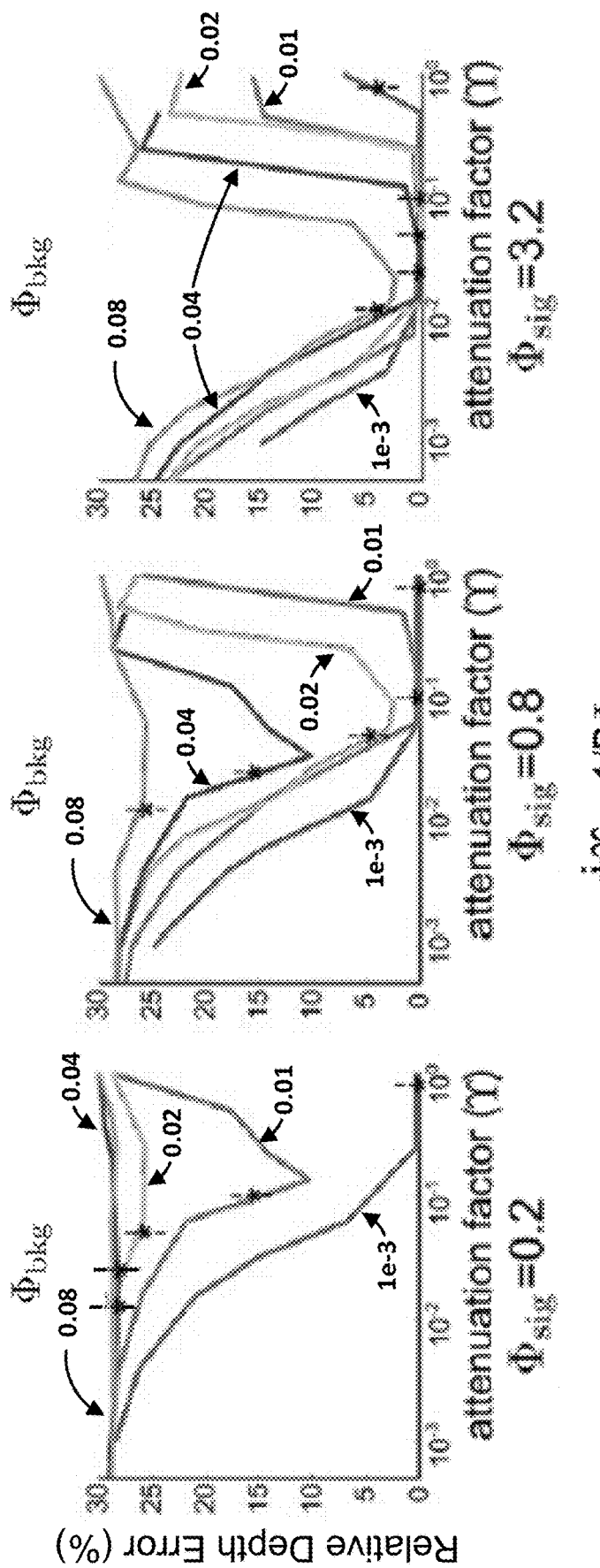
FIG. 9B1   FIG. 9B2   FIG. 9B3

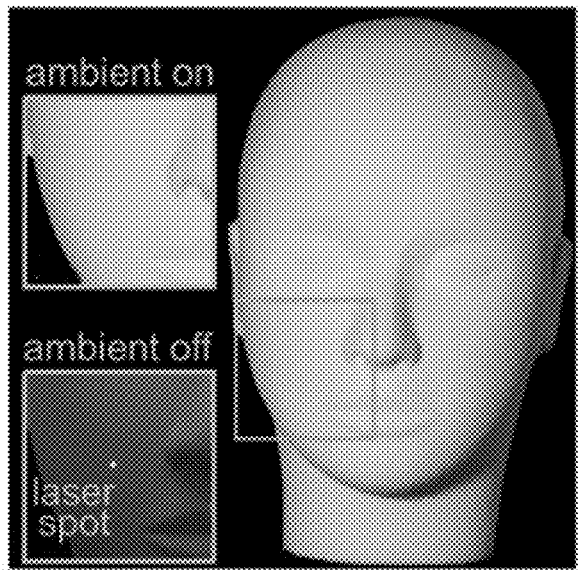
FIG. 10A
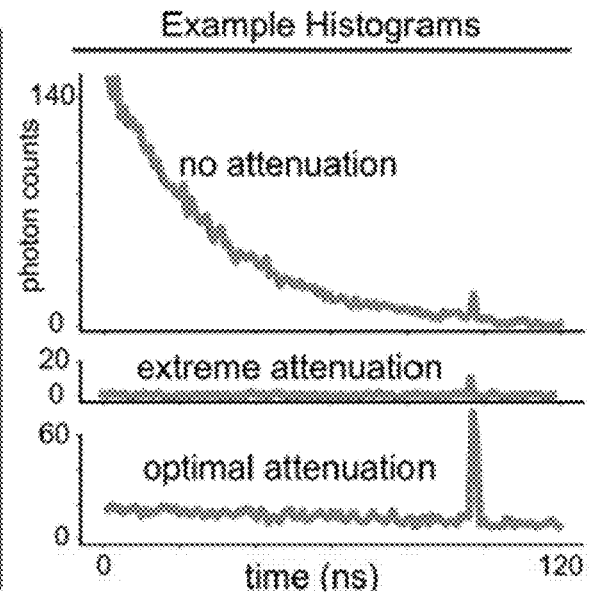
FIG. 10B
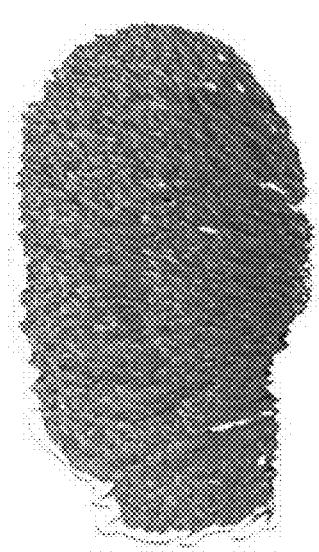
No attenuation
RMSE: 6.5 cm
FIG. 10C1
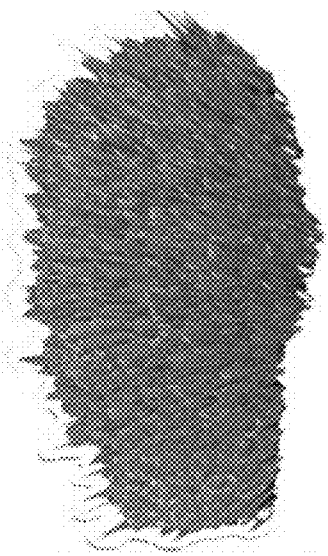
Extreme attenuation
13.4 cm
FIG. 10C2
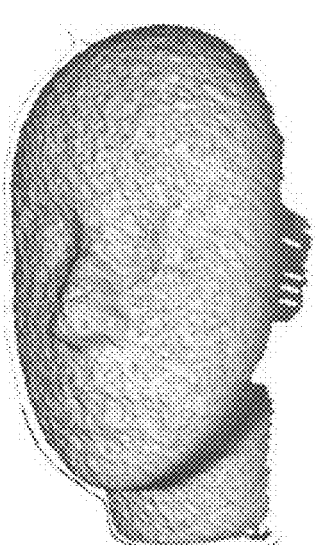
Optimal attenuation
0.3 cm
FIG. 10C3

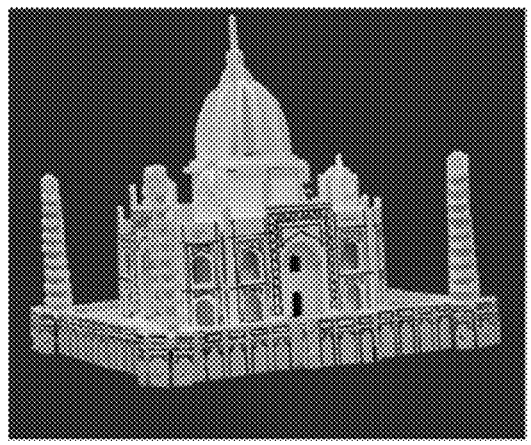
RGB Image
FIG. 11A1
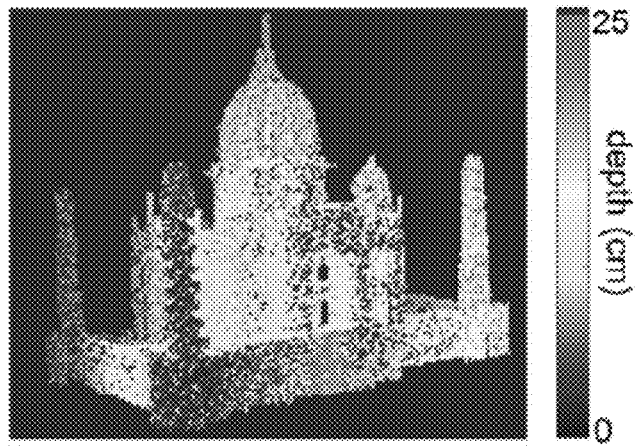
No attenuation
RMSE=18.4 cm
FIG. 11A2
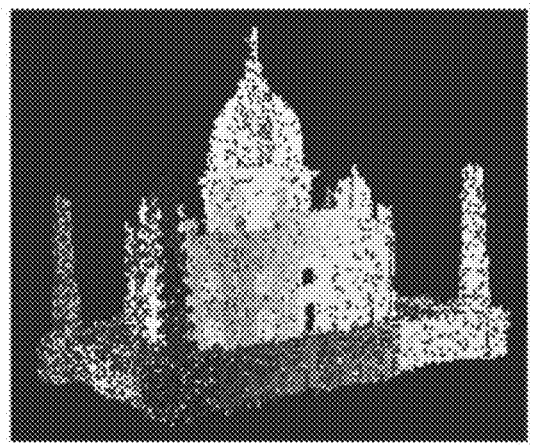
Extreme attenuation
RMSE=13.5 cm
FIG. 11A3
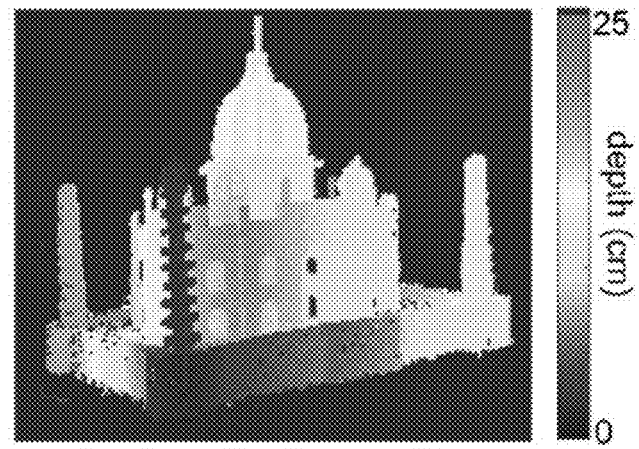
Optimal attenuation
RMSE=2.2 cm
FIG. 11A4

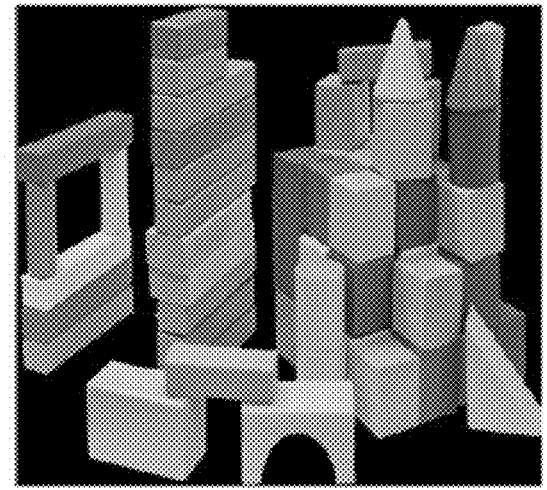
RGB Image
FIG. 11B1
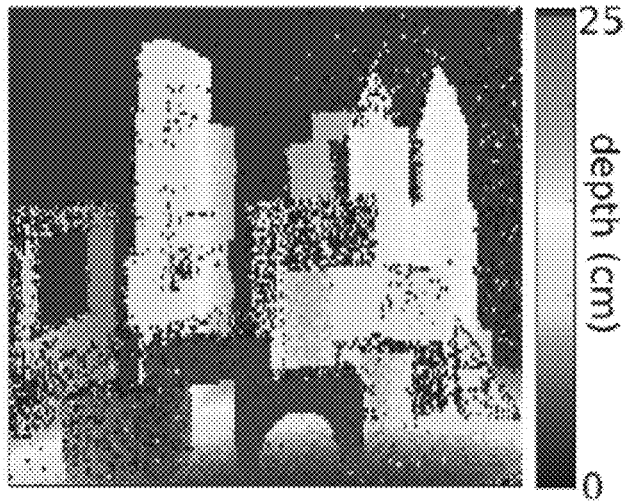
Extreme attenuation
RMSE=16.0 cm
FIG. 11B2
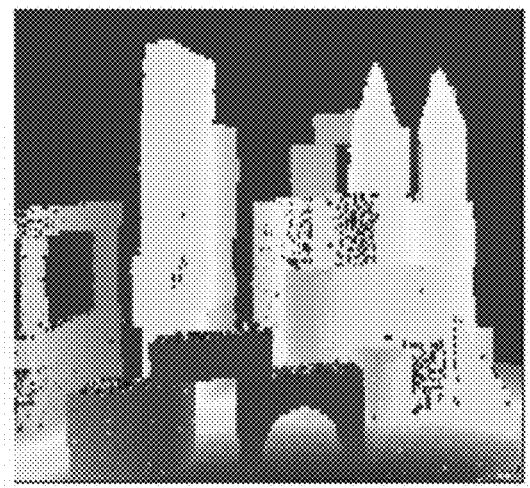
Adaptive attenuation
RMSE=7.7 cm
FIG. 11B3
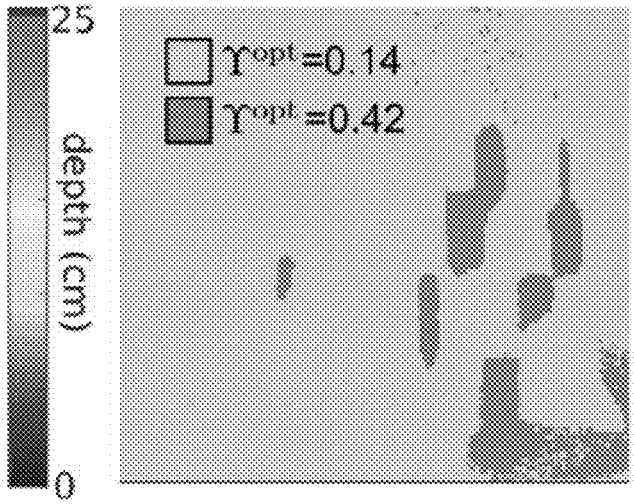
Attenuation map
FIG. 11B4

SYSTEMS, METHODS, AND MEDIA FOR SINGLE PHOTON DEPTH IMAGING WITH IMPROVED PRECISION IN AMBIENT LIGHT

STATEMENT REGARDING FEDERALLY SPONSORED RESEARCH

This invention was made with government support under HR0011-16-C-0025 awarded by the DOD/DARPA and N00014-16-1-2995 awarded by the NAVY/ONR. The government has certain rights in the invention.

CROSS-REFERENCE TO RELATED APPLICATIONS

N/A

BACKGROUND

Detectors that are capable of detecting the arrival time of an individual photon, such as single-photon avalanche diodes (SPADs), can facilitate active vision applications in which a light source is used to interrogate a scene. For example, such single-photon detectors have proposed for use with fluorescence lifetime-imaging microscopy (FLIM), non-line-of-sight (NLOS) imaging, transient imaging, and LiDAR systems. The combination of high sensitivity and high timing resolution has the potential to improve performance of such systems in demanding imaging scenarios, such as in systems having a limited power budget. For example, single-photon detectors can play a role in realizing effective long-range LiDAR for automotive applications (e.g., as sensors for autonomous vehicles) in which a power budget is limited and/or in which a signal strength of the light source is limited due to safety concerns.

FIG. 1A shows an example of a SPAD-based pulsed LiDAR system (sometimes referred to by other names such as Geiger-mode LiDAR and Single Photon LiDAR). The example shown in FIG. 1A includes a laser configured to send out light pulses periodically, and a SPAD that records the arrival time of the first detected photon in each laser period, after which it enters a dead time, during which the SPAD is inhibited from detecting any further photons. Note that the first detected photon is not necessarily the first photon that is incident on the SPAD, as some photons that are incident will not be detected (the proportion of incident photons detected is sometimes referred to as the quantum efficiency of the detector), and some detections result from noise rather than an incident photon.

In such systems, the first photon detection times in each laser cycle can be collected and used to generate a histogram of the time-of-arrival of the photons that represents the distribution of detections. For example, FIG. 1B shows a histogram representing arrival times of photons in a series of cycles with pile-up caused by ambient light. If the incident flux level is sufficiently low, the histogram can be expected to approximate a scaled version of the received temporal waveform of the reflected laser pulses. In such circumstances, the counts represented by the histogram can be used to estimate scene depths and reflectivity based on the location and height of a local maxima in the data represented by the histogram.

LiDAR that leverages SPAD-type detectors holds considerable promise due to the single-photon sensitivity and extremely high timing resolution, which corresponds to high depth resolution when used in a time-of-flight application. However, the histogram formation procedure can cause severe non-linear distortions when such a system is used with even modest intensity ambient light. A cause of this distortion is the dead time of the SPADs, which causes the SPAD to behave differently based on the flux incident on the detector. For example, when incident flux is high, whether a photon that is incident on the SPAD is detected is dependent on not only the quantum efficiency of the detector, but is also dependent on the detection of a previous photon. In the more particular example, in a SPAD-based LiDAR with a high incident flux on the SPAD due to ambient light, a photon from the ambient light source is much more likely to be the first photon detected by the SPAD than a photon from the laser source of the LiDAR. This leads to nonlinearities in the image formation model, as the measured histogram skews towards earlier time bins. This distortion, sometimes referred to as "pile-up," becomes more severe as the amount of ambient light incident on the SPAD increases, and consequently can lead to large depth errors. This can severely limit the performance of SPAD-based LiDAR that operate in outdoor conditions, such as a power-constrained automotive LiDAR operating on a bright sunny day. Note that in a conventional camera pixel (e.g., a conventional CCD or CMOS-based pixel) and in an avalanche photodiode (APD), the detection of a photon is generally independent of previous photons until the point of saturation. Consequently, in conventional, linear-mode LiDAR systems that use a conventional pixel or an APD, ambient light adds a constant value to the entire waveform.

Various techniques have been proposed for mitigating distortions resulting from pile-up. For example, one proposed technique is to extremely attenuate incident flux such that the image formation model becomes approximately linear. In many LiDAR applications, the signal intensity may be much lower than the ambient light intensity, such that lowering the flux (e.g., by reducing aperture size) incident on the SPAD to the degree required for the image formation model to become linear requires extremely attenuating both the ambient light and the signal light. While this can mitigate distortions, it also typically leads to signal loss due to the attenuation of the signal flux along with the ambient flux, lowering the signal to noise ratio, increasing error of the system, and requiring longer acquisition times to generate reliable depth estimates.

As another example, SPAD-based LiDAR, FLIM and NLOS imaging systems can be used in environments in which the incident flux is in a low enough range that pile-up distortions can be ignored. While this is an effective technique for mitigating distortions resulting from pile-up, many applications involve use of such imaging systems in environments with incident flux (e.g., from ambient sources) that is outside of the range in which pile-up distortions can be ignored.

As yet another example, computational techniques have been proposed that attempt to remove pile-up distortion caused by higher incident flux by computationally inverting the non-linear image formation model. While such techniques can mitigate relatively low levels of pile-up, these techniques are less successful in the presence of high flux levels, and in some cases can lead to both the signal and the noise being amplified noise when the incident flux exceeds a particular level providing little to no benefit.

As still another example, pile-up can be suppressed by modifying detector hardware, for instance, by using multiple SPADs per pixel connected to a single time correlated single photon counting (TCSPC) circuit to distribute the high incident flux over multiple SPADs. In such examples, multi- SPAD schemes with parallel timing units and multi-photon thresholds can be used to detect correlated signal photons and reject ambient light photons that are temporally randomly distributed. While these hardware-based solutions can mitigate some pile-up distortion, they can also increase the expense and complexity of the system.

Accordingly, systems, methods, and media for single photon depth imaging with improved precision in ambient light conditions are desirable.

SUMMARY

In accordance with some embodiments of the disclosed subject matter, systems, methods, and media for single photon depth imaging with improved precision in ambient light conditions are provided.

In accordance with some embodiments of the disclosed subject matter, a system for determining depths is provided, the system comprising: a light source; a detector configured to detect arrival of a single photon; an attenuation element configured to provide a variable attenuation factor, wherein an intensity of light perceived by the detector corresponds to a product of the attenuation factor and an intensity of light perceived by the detector in the absence of attenuation by the attenuation element; and a processor that is programmed to: (a) determine an ambient light intensity associated with a scene point; (b) select an attenuation factor based on the ambient light intensity; (c) estimate a depth of the scene point based on a multiplicity of photon arrival times determined using the detector during a period of time during which light incident on the detector is attenuated by the selected attenuation factor and during which the light source is configured to periodically emit a pulse of light toward the scene point; (d) repeat (a) through (c) for each of a multiplicity of scene points.

In some embodiments, the detector comprises a single photon avalanche diode (SPAD).

In some embodiments, the attenuation element comprises a diaphragm with a controllable aperture disposed between the scene point and the detector, and wherein the attenuation factor varies with a diameter of the aperture.

In some embodiments, the processor is further programmed to: cause the diameter of the aperture to adjust to a different diameter that provides the selected attenuation factor.

In some embodiments, the attenuation element comprises a plurality of attenuation elements, each of the plurality of attenuation elements having a different attenuation factor.

In some embodiments, one of the plurality of attenuation elements is disposed between the scene point and the detector.

In some embodiments, the processor is further programmed to: determine an optimum attenuation factor based on the ambient light intensity; and select an attenuation element of the plurality of attenuation elements that has an attenuation factor that is closest to the optimum attenuation factor.

In some embodiments, each of the plurality of attenuation elements is associated with one of a plurality of detectors and the selected attenuation element is associated with the detector, and wherein the processor is further programmed to: estimate the depth of the scene point based on data collected using the detector associated with the selected attenuation element.

In some embodiments, the attenuation element comprises a circuit that provides a bias voltage to the detector that affects the detector's quantum efficiency, and wherein the attenuation factor varies based on the bias voltage.

In some embodiments, the processor is further programmed to: (c1) determine, for an $i^{th}$ time bin of B time bins, a number $N_i$ corresponding to a number of detection events by the detector falling within the $i^{th}$ time bin during N cycles each having a cycle duration, wherein each of the multiplicity of photon arrival times is associated with one of the B time bins, and wherein each of the N cycles includes: (i) the light source emitting a pulse at a first time; and (ii) based on a signal output from the detector indicating that a photon was detected at a second time within the cycle duration, determining that an elapsed time between the first time and the second time corresponds to the $i^{th}$ time bin; (c2) repeat (c1) for each i from 1 to B; and (c3) estimate the depth based on a vector comprising values $(N_1, N_2, \ldots, N_B)$.

In some embodiments, the processor is further programmed to: estimate the depth of the scene point by applying a Coates-correction to the vector comprising values $(N_1, N_2, \ldots, N_B)$.

In some embodiments, the processor is further programmed to: (a1) determine, for an $i^{th}$ time bin of B time bins, a number $N'_i$ corresponding to a number of detection events by the detector falling within the $i^{th}$ time bin during N' cycles each having a cycle duration, wherein each of the N' cycles includes: (i) inhibiting the light source from emitting a pulse at a first time; and (ii) based on a signal output from the detector indicating that a photon was detected at a second time within the cycle duration, determining that an elapsed time between the first time and the second time corresponds to the $i^{th}$ time bin; (a2) repeat (a1) for each i from 1 to B; and (a3) determine the ambient light intensity associated with the scene point based on a vector comprising values $(N'_1, N'_2, \ldots N'_B)$.

In accordance with some embodiments of the disclosed subject matter, a method for determining depths is provided, the method comprising: (a) determining an ambient light intensity associated with a scene point; (b) selecting an attenuation factor based on the ambient light intensity; (c) estimating a depth of the scene point based on a multiplicity of photon arrival times detected by the detector during a period of time during which light incident on the detector is attenuated by an attenuation element configured to provide the selected attenuation factor and during which a light source is configured to periodically emit a pulse of light toward the scene point, wherein an intensity of light perceived by the detector corresponds to a product of the attenuation factor and an intensity of light perceived by the detector in the absence of attenuation by the attenuation element; (d) repeating (a) through (c) for each of a multiplicity of scene points.

In some embodiments, the detector comprises a single photon avalanche diode (SPAD).

In some embodiments, the attenuation element comprises a diaphragm with a controllable aperture disposed between the scene point and the detector, and wherein the attenuation factor varies with a diameter of the aperture.

In some embodiments, further comprising causing the diameter of the aperture to adjust to a different diameter that provides the selected attenuation factor.

In some embodiments, the attenuation element comprises a plurality of attenuation elements, each of the plurality of attenuation elements having a different attenuation factor.

In some embodiments, one of the plurality of attenuation elements is disposed between the scene point and the detector.

In some embodiments, further comprising: determining an optimum attenuation factor based on the ambient light intensity; and selecting an attenuation element of the plurality of attenuation elements that has an attenuation factor that is closest to the optimum attenuation factor.

In some embodiments, each of the plurality of attenuation elements is associated with one of a plurality of detectors and the selected attenuation element is associated with the detector, and wherein the method further comprises estimating the depth of the scene point based on data collected using the detector associated with the selected attenuation element.

In some embodiments, estimating the depth of the scene point comprises: (c1) determining, for an $i^{th}$ time bin of B time bins, a number $N_i$ corresponding to a number of detection events by the detector falling within the $i^{th}$ time bin during N cycles each having a cycle duration, wherein each of the multiplicity of photon arrival times is associated with one of the B time bins, and wherein each of the N cycles includes: (i) the light source emitting a pulse at a first time; and (ii) based on a signal output from the detector indicating that a photon was detected at a second time within the cycle duration, determining that an elapsed time between the first time and the second time corresponds to the $i^{th}$ time bin; (c2) repeating (c1) for each i from 1 to B; and (c3) estimating the depth based on a vector comprising values $(N_1, N_2, \ldots, N_B)$.

In some embodiments, estimating the depth of the scene point by applying a Coates-correction to the vector comprising values $(N_1, N_2, \ldots, N_B)$. In some embodiments, determining the ambient light intensity comprises: (a1) determining, for an $i^{th}$ time bin of B time bins, a number $N'_i$ corresponding to a number of detection events by the detector falling within the $i^{th}$ time bin during N' cycles each having a cycle duration, wherein each of the N' cycles includes: (i) inhibiting the light source from emitting a pulse at a first time; and (ii) based on a signal output from the detector indicating that a photon was detected at a second time within the cycle duration, determining that an elapsed time between the first time and the second time corresponds to the $i^{th}$ time bin; (a2) repeating (a1) for each i from 1 to B; and (a3) determining the ambient light intensity associated with the scene point based on a vector comprising values $(N'_1, N'_2, \ldots, N'_B)$.

In accordance with some embodiments of the disclosed subject matter, non-transitory computer readable medium containing computer executable instructions that, when executed by a processor, cause the processor to perform a method for determining depths is provided, the method comprising: (a) determining an ambient light intensity associated with a scene point; (b) selecting an attenuation factor based on the ambient light intensity; (c) estimating a depth of the scene point based on a multiplicity of photon arrival times detected by the detector during a period of time during which light incident on the detector is attenuated by an attenuation element configured to provide the selected attenuation factor and during which a light source is configured to periodically emit a pulse of light toward the scene point, wherein an intensity of light perceived by the detector corresponds to a product of the attenuation factor and an intensity of light perceived by the detector in the absence of attenuation by the attenuation element; (d) repeating (a) through (c) for each of a multiplicity of scene points.

In some embodiments, the detector comprises a single photon avalanche diode (SPAD).

In some embodiments, the attenuation element comprises a diaphragm with a controllable aperture disposed between the scene point and the detector, and wherein the attenuation factor varies with a diameter of the aperture.

In some embodiments, the method further comprises causing an aperture of the diaphragm to adjust to a size that provides the selected attenuation factor.

In some embodiments, the attenuation element comprises a plurality of attenuation elements, each of the plurality of attenuation elements having a different attenuation factor.

In some embodiments, one of the plurality of attenuation elements is disposed between the scene point and the detector.

In some embodiments, the method further comprises: determining an optimum attenuation factor based on the ambient light intensity; and selecting an attenuation element of the plurality of attenuation elements that is closest to the optimum attenuation factor.

In some embodiments, each of the plurality of attenuation elements is associated with one of a plurality of detectors and the selected attenuation element is associated with the detector, and wherein the method further comprises estimating the depth of the scene point based on data collected using the detector associated with the selected attenuation element.

In some embodiments, estimating the depth of the scene point comprises: (c1) determining, for an $i^{th}$ time bin of B time bins, a number $N_i$ corresponding to a number of detection events by the detector falling within the $i^{th}$ time bin during N cycles each having a cycle duration, wherein each of the multiplicity of photon arrival times is associated with one of the B time bins, and wherein each of the N cycles includes: (i) the light source emitting a pulse at a first time; and (ii) based on a signal output from the detector indicating that a photon was detected at a second time within the cycle duration, determining that an elapsed time between the first time and the second time corresponds to the $i^{th}$ time bin; (c2) repeating (c1) for each i from 1 to B; and (c3) estimating the depth based on a vector comprising values $(N_1, N_2, \ldots, N_B)$.

In some embodiments, estimating the depth of the scene point by applying a Coates-correction to the vector comprising values $(N_1, N_2, \ldots, N_B)$. In some embodiments, determining the ambient light intensity comprises: (al) determining, for an $i^{th}$ time bin of B time bins, a number $N'_i$ corresponding to a number of detection events by the detector falling within the $i^{th}$ time bin during N' cycles each having a cycle duration, wherein each of the N' cycles includes: (i) inhibiting the light source from emitting a pulse at a first time; and (ii) based on a signal output from the detector indicating that a photon was detected at a second time within the cycle duration, determining that an elapsed time between the first time and the second time corresponds to the $i^{th}$ time bin; (a2) repeating (a1) for each i from 1 to B; and (a3) determining the ambient light intensity associated with the scene point based on a vector comprising values $(N'_1, N'_2, \ldots, N'_B)$.

In accordance with some embodiments of the disclosed subject matter, a system for determining depths is provided, the system comprising: a light source; a detector configured to detect arrival of a single photon; an attenuation element configured to provide an attenuation factor in the range of 0.05 and 0.8, wherein an intensity of light perceived by the detector corresponds to a product of the attenuation factor and an intensity of light perceived by the detector in the absence of the attenuation element, and wherein the attenuation factor is inversely proportional to an average ambient intensity of a daytime operating environment of the system; and a processor that is programmed to: (c) estimate a depth of the scene point based on a multiplicity of photon arrival times detected by the detector during a period of time during which light incident on the detector is attenuated by the selected attenuation factor and during which the light source is configured to periodically emit a pulse of light toward the scene point; (d) repeat (a) through (c) for each of a multiplicity of scene points.

In some embodiments, the attenuation element comprises a neutral density filter with a fractional transmittance equal to the attenuation factor.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements.

FIG. 2A1 shows an example of light impinging on a SPAD-based pulsed LiDAR system over a cycle in the absence of ambient light.

FIG. 2A2 shows an example of photons detected by a SPAD of a SPAD-based pulsed LiDAR system over various cycles corresponding to the example shown in FIG. 2A1.

FIG. 2A3 shows an example of a histogram based on received photons over n cycles based on the time at which a first photon was detected by the SPAD in each cycle.

FIG. 2B1 shows an example of light impinging on a SPAD-based pulsed LiDAR system over a cycle in the presence of ambient light.

FIG. 2B2 shows an example of photons detected by a SPAD of a SPAD-based pulsed LiDAR system over various cycles corresponding to the example shown in FIG. 2B1, and photons that subsequently would have been detected by the SPAD in each cycle.

FIG. 2B3 shows an example of a histogram based on received photons over n cycles based on the time at which a first photon was detected by the SPAD in each cycle.

FIG. 3A1 shows an example of light impinging on a SPAD-based pulsed LiDAR system over a cycle in the presence of ambient light at a first (low) intensity.

FIG. 3A2 shows an example of light impinging on a SPAD-based pulsed LiDAR system over a cycle in the presence of ambient light at a second higher intensity.

FIG. 3A3 shows an example of light impinging on a SPAD-based pulsed LiDAR system over a cycle in the presence of ambient light at a third yet higher intensity.

FIG. 3B1 shows an example of a histogram based on photons detected by a SPAD-based pulsed LiDAR system over various cycles in the presence of ambient light at the first intensity shown in FIG. 3A1.

FIG. 3B2 shows an example of a histogram based on photons detected by a SPAD-based pulsed LiDAR system over various cycles in the presence of ambient light at the second intensity shown in FIG. 3A2.

FIG. 3B3 shows an example of a histogram based on photons detected by a SPAD-based pulsed LiDAR system over various cycles in the presence of ambient light at the third intensity shown in FIG. 3A3.

FIG. 3C1 shows an example of a Coates-corrected estimate of the Poisson rate at each time bin based on the histogram in FIG. 3B1.

FIG. 3C2 shows an example of a Coates-corrected estimate of the Poisson rate at each time bin based on the histogram in FIG. 3B2.

FIG. 3C3 shows an example of a Coates-corrected estimate of the Poisson rate at each time bin based on the histogram in FIG. 3B3.

FIG. 7A1 shows an example of simulated relative depth errors for various light source signal intensities in the presence of ambient light at a first (low) intensity as a function of attenuation factor.

FIG. 7A2 shows an example of simulated relative depth errors for various light source signal intensities in the presence of ambient light at a second intensity as a function of attenuation factor.

FIG. 7A3 shows an example of simulated relative depth errors for various light source signal intensities in the presence of ambient light at a third intensity as a function of attenuation factor.

FIG. 7B1 shows an example of simulated relative depth errors for various ambient light intensities and a first source signal intensity as a function of attenuation factor.

FIG. 7B2 shows an example of simulated relative depth errors for various ambient light intensities and a second source signal intensity as a function of attenuation factor.

FIG. 7B3 shows an example of simulated relative depth errors for various ambient light intensities and a third source signal intensity as a function of attenuation factor.

FIG. 9A1 shows an example of observed relative depth errors for various light source signal intensities in the presence of ambient light at a first (low) intensity as a function of attenuation factor.

FIG. 9A2 shows an example of observed relative depth errors for various light source signal intensities in the presence of ambient light at a second intensity as a function of attenuation factor.

FIG. 9A3 shows an example of observed relative depth errors for various light source signal intensities in the presence of ambient light at a third intensity as a function of attenuation factor.

FIG. 9B1 shows an example of observed relative depth errors for various ambient light intensities and a first source signal intensity as a function of attenuation factor.

FIG. 9B2 shows an example of observed relative depth errors for various ambient light intensities and a second source signal intensity as a function of attenuation factor.

FIG. 9B3 shows an example of simulated relative depth errors for various ambient light intensities and a third source signal intensity as a function of attenuation factor.

FIG. 10A shows an example of a scene including a mannequin face that was imaged using a SPAD-based pulsed LiDAR system with different attenuation factors in the presence of ambient light at a high intensity, including an attenuation factor ("optimal attenuation") determined in accordance with some embodiments of the disclosed subject matter.

FIG. 10B shows an example of histograms representing a point on the scene of FIG. 10A in the presence of ambient light at a high intensity generated using different attenuation factors.

FIG. 10C1 shows an example of a surface generated from depth information generated by a SPAD-based pulsed LiDAR system with no attenuation.

FIG. 10C2 shows an example of a surface generated from depth information generated by a SPAD-based pulsed LiDAR system with extreme attenuation.

FIG. 10C3 shows an example of a surface generated from depth information generated by a SPAD-based pulsed LiDAR system with an attenuation determined for the scene in accordance with some embodiments of the disclosed subject matter.

FIG. 11A1 shows an example of a scene including a model of a building that was imaged using a SPAD-based pulsed LiDAR system with different attenuation factors in the presence of ambient light at a moderate intensity, including an attenuation factor ("optimal attenuation") determined in accordance with some embodiments of the disclosed subject matter.

FIG. 11A2 shows an example of a depth map representing depth information generated by a SPAD-based pulsed LiDAR system with no attenuation.

FIG. 11A3 shows an example of a depth map representing depth information generated by a SPAD-based pulsed LiDAR system with extreme attenuation.

FIG. 11A4 shows an example of a depth map representing depth information generated by a SPAD-based pulsed LiDAR system with an attenuation determined in accordance with some embodiments of the disclosed subject matter.

FIG. 11B1 shows an example of a scene with a wide range of illumination levels, albedo variations, and multiple objects over a relatively wide depth range that was imaged using a SPAD-based pulsed LiDAR system with different attenuation factors in the presence of ambient light having an intensity that varies over the scene illuminated by a light source having moderate intensity, including an attenuation factor ("adaptive attenuation") determined on a per-location basis in accordance with some embodiments of the disclosed subject matter and selected from a discrete number of attenuation levels.

FIG. 11B2 shows an example of a depth map representing depth information generated by a SPAD-based pulsed LiDAR system with extreme attenuation.

FIG. 11B3 shows an example of a depth map representing depth information generated by a SPAD-based pulsed LiDAR system with an attenuation determined in accordance with some embodiments of the disclosed subject matter.

FIG. 11B4 shows an example of an attenuation map representing the attenuation factor used while generating scene depth information with a SPAD-based pulsed LiDAR system.

DETAILED DESCRIPTION

In accordance with various embodiments, mechanisms (which can, for example, include systems, methods, and media) for single photon depth imaging with improved precision in ambient light conditions are provided.

In some embodiments, the mechanisms described herein can use a closed-form expression to determine an optimal incident flux given a fixed ratio of source-to-ambient light strengths. For example, under certain assumptions, the optimal flux is quasi-invariant to source strength and scene depths, and may depend only on the strength of the ambient flux and the unambiguous depth range of the system.

As described below, the amount of incident flux that results in improved precision is generally lower than that encountered by a LiDAR system in typical outdoor daytime conditions. This suggests that, somewhat counter-intuitively, reducing the total flux can improve performance, even if that requires attenuating the signal. However, the amount of incident flux that results in improved precision is generally is generally considerably higher than the level at which the image formation model enters the linear regime. Accordingly, the amount of incident flux that results in improved precision can still exhibit some degree of pile-up distortion, which can be mitigated using approaches such as computational depth estimation techniques and/or neural network based depth estimation techniques while achieving higher performance across a wide range of imaging scenarios (e.g., as compared to using the same technique(s) with no attenuation or extreme attenuation).

In some embodiments, based on a theoretical model of optimal flux (e.g., a level of flux that results in improved precision given a particular ratio of source-to-ambient light strengths and unambiguous depth range), the mechanisms described herein can be used to implement an adaptive attenuation technique for SPAD-based LiDAR in which the amount of incident flux is adapted based on an estimate of the ambient light strength in a particular scene and/or at a particular location within the scene. As described below, simulations and hardware experiments demonstrate that the mechanisms described herein can achieve greater depth precision (e.g., by an order of magnitude) as compared to conventional rule-of-thumb approaches that involve lowering flux levels to linear regimes.

Figure 1A:
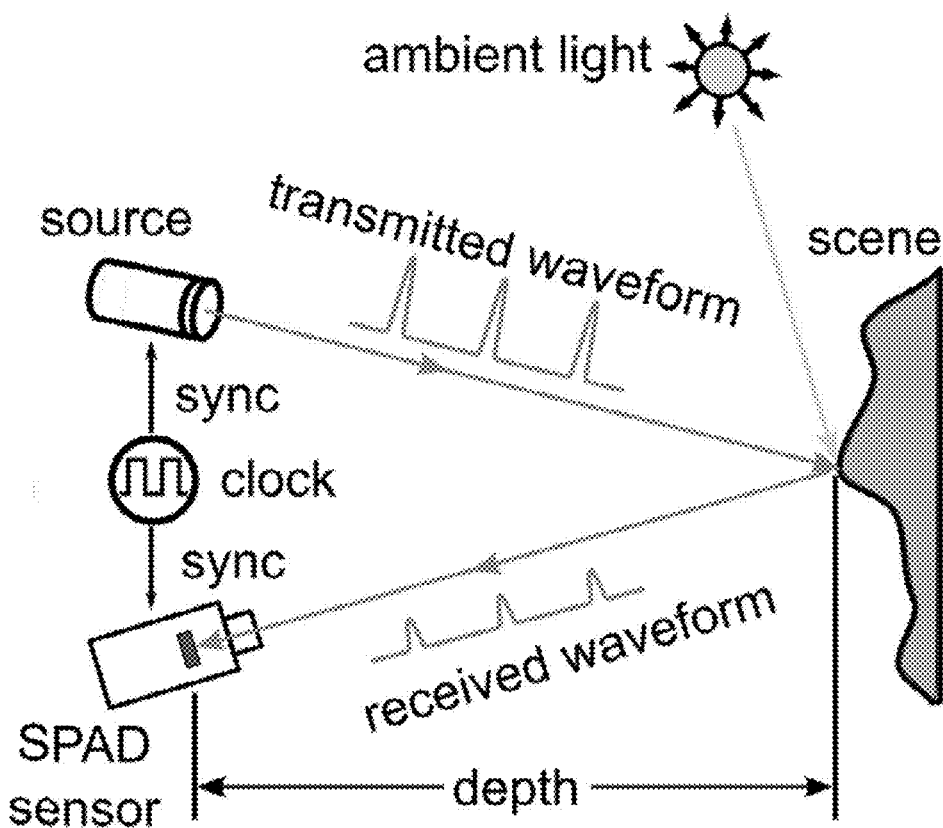
FIG. 1A shows an example of a single photon avalanche diode (SPAD)-based pulsed LiDAR system.
Figure 1B:
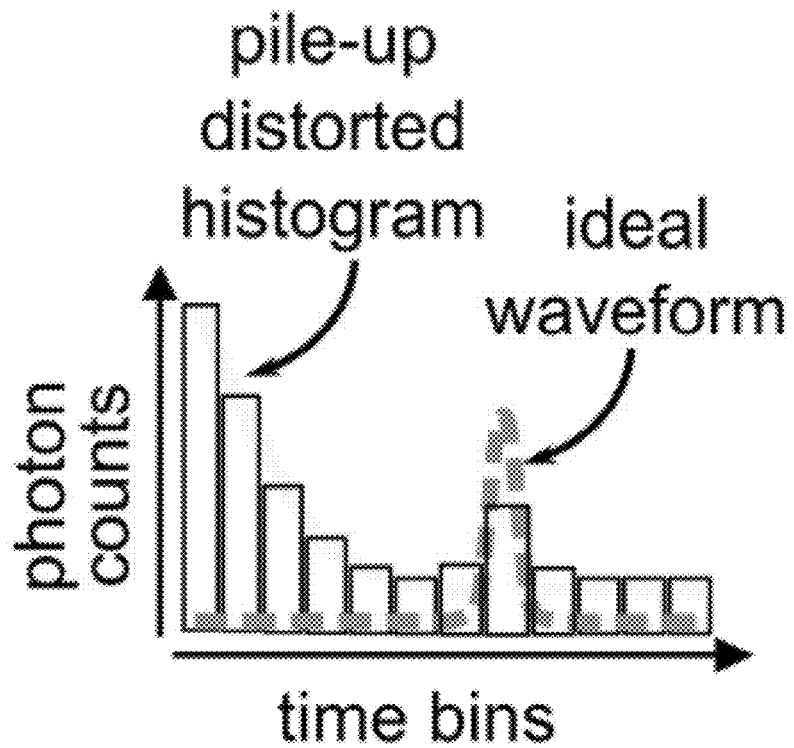
FIG. 1B shows an example of a histogram representing arrival times of photons in a series of cycles with pile-up caused by ambient light.

As described above in connection with FIGS. 1A and 1B, conventional SPAD-based pulsed LiDAR systems include a laser source configured to transmit periodic short pulses of light toward a scene point, and a co-located SPAD detector which is configured to observe the reflected light. An ideal laser pulse in such a system can be modeled as a Dirac delta function $\delta(t)$. If d is used to represent the distance of the scene point from the sensor, and $\tilde{\tau}=2d/c$ is the round trip time-of-flight for a light pulse from the source to the scene and back to the detector, the time-varying photon flux incident on the SPAD sensor can be represented as:

$$\Phi(t)=\tilde{\Phi}_{sig}\delta(t-\tilde{\tau})+\tilde{\Phi}_{bkg}, \quad (1)$$

where $\tilde{\Phi}_{sig}$ is a signal component of the received wave-form, which can account for the laser source power, light fall-off, scene brightness and bidirectional reflectance distribution function (BRDF). $\tilde{\Phi}_{bkg}$ can denote a background component, which can be assumed to be a constant due to ambient light. Since SPADs have a finite time resolution (e.g., a few tens of picoseconds), a discretized version of the continuous waveform in EQ. (1) using uniformly spaced time bins of size $\Delta$ can be used to represent the time-varying photon flux. If $M_i$ is used to represent the number of photons incident on the SPAD in the $i^{th}$ time bin, $M_i$ can be expected to follow a Poisson distribution due to arrival statistics of photons. The mean of the Poisson distribution, $\mathbb{E}[M_i]E[Mi]$, which can represent the average number $r_i$ of photons incident in the $i^{th}$ bin, can be represented as:

$$r_i = \Phi_{sig}\delta_{i,\tau} + \Phi_{bkg}. \tag{2}$$

Here, $\delta_{i,j}$ is the Kronecker delta, which can be defined as $\delta_{i,j}=1$ for $i=j$ and 0 otherwise. $\Phi_{sig}$ is the mean number of signal photons received per bin, and $\Phi_{bkg}$ is the (undesirable) background and dark count photon flux per bin. If B is used to represent the total number of time bins, vector of values $(r_1, r_2, \ldots, r_B)$ can be defined as an ideal incident waveform.

In general, SPAD-based LiDAR systems can operate using TCSPC techniques. This can involve illuminating a scene point with a periodic train of laser pulses. Each period starting with a laser pulse can be referred to as a cycle. FIG. 2A1 shows an example of light impinging on a SPAD-based pulsed LiDAR system over a cycle in the absence of ambient light. A cycle can begin at the vertical axis of FIG. 2A1, and the returning light that is incident on the SPAD-based LiDAR system can be a scaled version of the pulse that was emitted by the source that arrives at a time within the cycle that corresponds to a particular scene depth. FIG. 2B1 shows an example of light impinging on a SPAD-based pulsed LiDAR system over a cycle in the presence of ambient light. A cycle can begin at the vertical axis of FIG. 2B1, and the returning light that is incident on the SPAD-based LiDAR system can be a scaled version of the pulse that was emitted by the source with a constant component corresponding to $\Phi_{bkg}$, where the pulse arrives at a time within the cycle that corresponds to a particular scene depth.

In some SPAD-based LiDAR systems the SPAD is configured to detect only the first incident photon in each cycle, after which the SPAD enters a dead time (e.g., of 100 nanoseconds or more), during which it is inhibited from detecting photons. FIG. 2A2 shows an example of photons detected by a SPAD of a SPAD-based pulsed LiDAR system over various cycles corresponding to the example shown in FIG. 2A1. As shown in FIG. 2A2, in the absence of ambient flux (e.g., with $\Phi_{bkg}$ approximately equal to 0), the first photon detection event recorded by the SPAD corresponds to a photon representing the return pulse reflected from the scene point. Note that, although not shown in FIG. 2A2, noise can cause detection events in time bins that do not correspond to the depth of the scene and/or a photon may not be detected at all in some cycles (e.g., none of the photons emitted by the source and reflected by the scene point were detected, which can occur due to the detector having a quantum efficiency less than 1, or for other reasons).

FIG. 2B2 shows an example of photons detected by a SPAD of a SPAD-based pulsed LiDAR system over various cycles corresponding to the example shown in FIG. 2B1, and photons that subsequently would have been detected by the SPAD in each cycle. As shown in FIG. 2B2, in the presence of ambient flux (e.g., with a significant $\Phi_{bkg}$), the first photon detection event recorded by the SPAD generally does not correspond to a photon representing the return pulse reflected from the scene point. Rather, the first photon detected in each cycle is likely to be an ambient light photon that is detected before the time bin corresponding to the depth of the scene point. As shown in FIG. 2B2, in the presence of ambient light many signal photons can be missed due to the earlier detection of an ambient photon.

The time of arrival of the first incident photon in each cycle can be recorded with respect to the start of the most recent cycle, and the arrival times can be used to construct a histogram of first photon arrival times over many laser cycles. FIG. 2A3 shows an example of a histogram based on received photons over n cycles based on the time at which a first photon was detected by the SPAD in each cycle in the absence of ambient light. As shown in FIG. 2A3, the histogram generally corresponds to a time-shifted and scaled version of the light pulse emitted by the source at the beginning of each cycle.

FIG. 2B3 shows an example of a histogram based on received photons over n cycles based on the time at which a first photon was detected by the SPAD in each cycle in the presence of ambient light. As shown in FIG. 2B3, the histogram constructed from the arrival times in the presence of ambient light exhibits a large pile-up near the beginning of the cycle that is much larger than the magnitude of the signal. For example, while a small increase in photon count may be observable in the histogram at the time bin corresponding to the depth of the scene point, the magnitude of the increase is dramatically reduced as compared to the example shown in FIG. 2A3.

If the histogram includes B time bins, the laser repetition period can be represented as being equal to $B\Delta$, which can correspond to an unambiguous depth range of $d_{max}=cB\Delta/2$. As the SPAD only records the first photon in each cycle, a photon is detected in the $i^{th}$ bin only if at least one photon is incident on the SPAD during the $i^{th}$ bin, and, no photons are incident in the preceding bins. The probability $q_i$ that at least one photon is incident during the $i^{th}$ bin can be computed using the Poisson distribution with mean $r_i$:

$$q_i = P(M_i \geq 1) = 1 - e^{-r_i}.$$

Thus, the probability $p_i$ of detecting a photon in the $i^{th}$ bin, in any laser cycle, can be represented as:

$$p_i = q_i \pi_{k=1}^{i-1}(1-q_k) = (1-e^{-r_i})e^{-\Sigma_{k=1}^{i-1} r_k}. \tag{3}$$

If N represents the total number of laser cycles used for forming a histogram and $N_i$ represents the number of photons detected in the $i^{th}$ histogram bin, the vector $(N_1, N_2, \ldots, N_{B+1})$ of the histogram counts can follow a multinomial distribution that can be represented as:

$$(N_1, N_2, \ldots, N_{B+1}) \sim \text{MULT}(N, (p_1, p_2, \ldots, p_{B+1})), \tag{4}$$

where, for convenience, an additional $(B+1)^{st}$ index is included in the histogram to record the number of cycles with no detected photons. Note that $p_{B+1}=1-\Sigma_{i=1}^{B+1} p_i$ and $N=\Sigma_{i=1}^{B+1} N_i$. EQ. (4) describes a general probabilistic model for the histogram of photon counts acquired by a SPAD-based pulsed LiDAR.

As described above, FIGS. 2A1 to 2A3 shows an example of histogram formation in the case of negligible ambient light. In that example, all (e.g., ignoring detections resulting from noise) the photon arrival times can be expected to line up with the location of the peak of the incident waveform. As a result, $r_i=0$ for all the bins except that corresponding to the laser impulse peak as shown in FIG. 2A3. The measured histogram vector $(N_1, N_2, \ldots, N_B)$ for such an example can, on average, be a scaled version of the incident waveform ($r_1, r_2, \ldots, r_B$). The time-of-flight can then be estimated by locating the bin index with the highest photon counts:

$$\hat{r} = \operatorname*{argmax}_{1 \leq i \leq B} N_i, \quad (5)$$

and the scene depth can be estimated as $\hat{d} = c\hat{\tau}\Delta/2$. Note that this assumes a perfect laser impulse with a duration of a single time bin, and ignores SPAD non-idealities such as jitter and afterpulsing noise.

FIGS. 3A1 to 3A3 show examples of light impinging on a SPAD-based pulsed LiDAR system over a cycle in the presence of ambient light at a first (low) intensity, a second higher intensity, and a third yet higher intensity. As shown in FIGS. 3A1 to 3A3, the waveform incident on the SPAD in a pulsed LiDAR system can be modeled as an impulse with a constant vertical shift (e.g., which can be analogized to a DC shift in an electrical signal) corresponding to the amount of ambient light incident on the SPAD. However, due to pile-up effects, the measured histogram does not reliably reproduce this "DC shift" due to the histogram formation procedure that only records the first photon for each laser cycle.

FIGS. 3B1 to 3B3 show examples of histograms based on photons detected by a SPAD-based pulsed LiDAR system over various cycles in the presence of ambient light at the first intensity, the second intensity, and the third intensity, respectively. As shown in FIGS. 3B1 to 3B3, as the ambient flux increases, the SPAD detects an ambient photon in the earlier histogram bins with increasing probability, resulting in a distortion with an exponentially decaying shape. As shown in FIG. 3B2, the peak due to laser source appears only as a small blip in the exponentially decaying tail of the measured histogram, whereas in FIG. 3B3, the peak due to the laser source is indistinguishable from the tail of the measured histogram. Note that the distortion becomes more prominent as the return signal strength decreases (e.g., for scene points that are farther from the imaging system and/or scene points that are less reflective at the frequency of the source). This distortion can significantly lower the accuracy of depth estimates because the bin corresponding to the true depth no longer receives the maximum number of photons. In the extreme case, the later histogram bins might receive no photons, making depth reconstruction at those bins impossible.

FIGS. 3C1 to 3C3 show examples of Coates-corrected estimates of the Poisson rate at each time bin based on the histograms in FIGS. 3B1 to 3B3. It is theoretically possible to "undo" the distortion by computationally inverting the exponential nonlinearity of EQ. (3), and an estimate $\hat{r}$ of the incident waveform $r_i$ in terms of the measured histogram $N_i$ can be found using the following expression:

$$\hat{r} = \ln\left(\frac{N - \sum_{k=1}^{i-1} N_k}{N - \sum_{k=1}^{i-1} N_k - N_i}\right), \quad (6)$$

This technique is sometimes referred to as Coates's correction, and it can be demonstrated that this is the best unbiased estimator of $r_i$ for a given histogram (e.g., See Appendix A, which is hereby incorporated by reference herein in its entirety). The depth can then be estimated as $$\hat{\tau} = \operatorname*{argmax}_{1 \leq i \leq B} \hat{r}_i.$$

Note that although this computational approach can remove distortion, the non-linear mapping from measurements $N_i$ to the estimate $\hat{r}_i$ can significantly amplifies measurement noise due to high variance of the estimates at later time bins, as shown in FIGS. 3C2 and 3C3.

Figure 4:
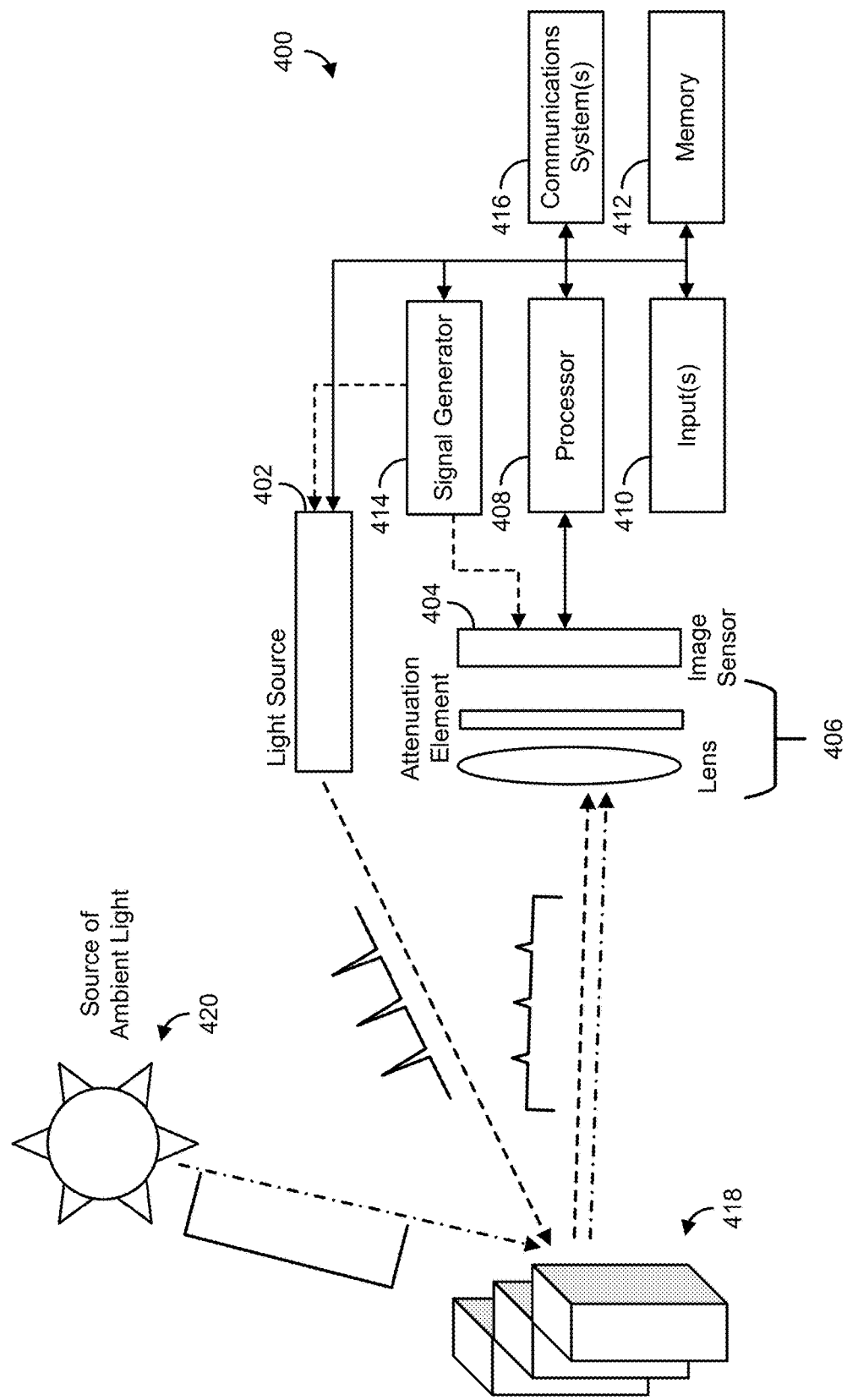
FIG. 4 shows an example of a system for single photon depth imaging with improved precision in ambient light conditions in accordance with some embodiments of the disclosed subject matter.

FIG. 4 shows an example 400 of a system for single photon depth imaging with improved precision in ambient light conditions in accordance with some embodiments of the disclosed subject matter. As shown, system 400 can include a light source 402; an image sensor 404 (e.g., an area sensor that includes a single detector or an array of detectors); optics 406 (which can include, for example, one or more lenses, one or more attenuation elements such as a filter, a diaphragm, and/or any other suitable optical elements such as a beam splitter, etc.), a processor 408 for controlling operations of system 400 which can include any suitable hardware processor (which can be a central processing unit (CPU), a digital signal processor (DSP), a microcontroller (MCU), a graphics processing unit (GPU), etc.) or combination of hardware processors; an input device/display 410 (such as a shutter button, a menu button, a microphone, a touchscreen, a motion sensor, a liquid crystal display, a light emitting diode display, etc., or any suitable combination thereof) for accepting input from a user and/or from the environment, and/or for presenting information (e.g., images, user interfaces, etc.) for consumption by a user; memory 412; a signal generator 414 for generating one or more signals to control operation of light source 402 and/or image sensor 404; and a communication system or systems 416 for facilitating communication between system 400 and other devices, such as a smartphone, a wearable computer, a tablet computer, a laptop computer, a personal computer, a server, an embedded computer (e.g., for controlling an autonomous vehicle, robot, etc.), etc., via a communication link. In some embodiments, memory 412 can store scene depth information, image data, and/or any other suitable data. Memory 412 can include a storage device (e.g., a hard disk, a Blu-ray disc, a Digital Video Disk, RAM, ROM, EEPROM, etc.) for storing a computer program for controlling processor 408. In some embodiments, memory 412 can include instructions for causing processor 408 to execute processes associated with the mechanisms described herein, such as a process described below in connection with FIG. 6.

In some embodiments, light source 402 can be any suitable light source that can be configured to emit modulated light (e.g., as a stream of pulses each approximating Dirac delta function) toward a scene 418 illuminated by an ambient light source 420 in accordance with a signal received from signal generator 416. For example, light source 402 can include one or more laser diodes, one or more lasers, one or more light emitting diodes, and/or any other suitable light source. In some embodiments, light source 402 can emit light at any suitable wavelength. For example, light source 402 can emit ultraviolet light, visible light, near-infrared light, infrared light, etc. In a more particular example, light source 402 can be a coherent light source that emits light in the green portion of the visible spectrum (e.g., centered at 532 nm). In another more particular example, light source 402 can be a coherent light source that emits light in the infrared portion of the spectrum (e.g., centered at a wavelength in the near-infrared such as 1060 nm or 1064 nm).

In some embodiments, image sensor 404 can be an image sensor that is implemented at least in part using one or more SPAD detectors (sometimes referred to as a Geiger-mode avalanche diode) and/or one or more other detectors that are configured to detect the arrival time of individual photons. In some embodiments, one or more elements of image sensor 404 can be configured to generate data indicative of the arrival time of photons from the scene via optics 406. For example, in some embodiments, image sensor 404 can be a single SPAD detector. As another example, image sensor 404 can be an array of multiple SPAD detectors. As yet another example, image sensor 404 can be a hybrid array including one or more SPAD detectors and one or more conventional light detectors (e.g., CMOS-based pixels). As still another example, image sensor 404 can be multiple image sensors, such as a first image sensor that includes one or more SPAD detectors that is used to generate depth information and a second image sensor that includes one or more conventional pixels that is used to generate ambient brightness information and/or image data. In such an example, optics can included in optics 406 (e.g., multiple lenses, a beam splitter, etc.) to direct a portion of incoming light toward the SPAD-based image sensor and another portion toward the conventional image sensor that is used for light metering.

In some embodiments, system 400 can include additional optics. For example, although optics 406 is shown as a single lens and attenuation element, it can be implemented as a compound lens or combination of lenses. Note that although the mechanisms described herein are generally described as using SPAD-based detectors, this is merely an example of a single photon detector that is configured to record the arrival time of a pixel with a time resolution on the order of picoseconds, and other components can be used in place of SPAD detectors. For example, a photomultiplier tube in Geiger mode can be used to detect single photon arrivals.

In some embodiments, optics 406 can include optics for focusing light received from scene 418, one or more narrow bandpass filters centered around the wavelength of light emitted by light source 402, any other suitable optics, and/or any suitable combination thereof. In some embodiments, a single filter can be used for the entire area of image sensor 404 and/or multiple filters can be used that are each associated with a smaller area of image sensor 104 (e.g., with individual pixels or groups of pixels). Additionally, in some embodiments, optics 406 can include one or more optical components configured to attenuate the input flux. For example, in some embodiments, optics 406 can include a neutral density filter in addition to or in lieu of a narrow bandpass filter. As another example, optics 406 can include a diaphragm that can attenuate the amount of input flux that reaches image sensor 404. In some embodiments, one or more attenuation elements can be implemented using elements that can vary the amount of attenuation. For example, a neutral density filter can be implemented with one or more active elements, such as a liquid crystal shutter. As another example, a variable neutral density filter can be implemented with a filter wheel that has continuously variable attenuation factor. As yet another example, a variable neutral density filter can be implemented with an acousto-optic tunable filter. As still another example, image sensor 404 can include multiple detector elements that are each associated with a different attenuation factor. As a further example, the quantum efficiency of a SPAD detector can be dependent on a bias voltage applied to the SPAD. In such an example, image sensor 404 can include multiple SPAD detectors having a range of bias voltages, and correspondingly different quantum efficiencies. Additionally or alternatively, in such an example, the bias voltage(s) of one or more SPAD detectors in image sensor 404 can be provided by a circuit that can be controlled to programmatically vary the bias voltage to change the quantum efficiency, thereby varying the effective attenuation factor of the detector and hence the detector's photon detection sensitivity.

In some embodiments, system 400 can communicate with a remote device over a network using communication system(s) 414 and a communication link. Additionally or alternatively, system 400 can be included as part of another device, such as a smartphone, a tablet computer, a laptop computer, an autonomous vehicle, a robot, etc. Parts of system 400 can be shared with a device within which system 400 is integrated. For example, if system 400 is integrated with an autonomous vehicle, processor 408 can be a processor of the autonomous vehicle and can be used to control operation of system 400.

In some embodiments, system 400 can communicate with any other suitable device, where the other device can be one of a general purpose device such as a computer or a special purpose device such as a client, a server, etc. Any of these general or special purpose devices can include any suitable components such as a hardware processor (which can be a microprocessor, digital signal processor, a controller, etc.), memory, communication interfaces, display controllers, input devices, etc. For example, the other device can be implemented as a digital camera, security camera, outdoor monitoring system, a smartphone, a wearable computer, a tablet computer, a personal data assistant (PDA), a personal computer, a laptop computer, a multimedia terminal, a game console, a peripheral for a game counsel or any of the above devices, a special purpose device, etc.

Communications by communication system 414 via a communication link can be carried out using any suitable computer network, or any suitable combination of networks, including the Internet, an intranet, a wide-area network (WAN), a local-area network (LAN), a wireless network, a digital subscriber line (DSL) network, a frame relay network, an asynchronous transfer mode (ATM) network, a virtual private network (VPN). The communications link can include any communication links suitable for communicating data between system 100 and another device, such as a network link, a dial-up link, a wireless link, a hard-wired link, any other suitable communication link, or any suitable combination of such links.

It should also be noted that data received through the communication link or any other communication link(s) can be received from any suitable source. In some embodiments, processor 408 can send and receive data through the communication link or any other communication link(s) using, for example, a transmitter, receiver, transmitter/receiver, transceiver, or any other suitable communication device.

FIGS. 5A and 5B show examples of bin receptivity curves for various attenuation levels and a particular ambient light intensity in linear scale and log scale, respectively. One way to mitigate pile up is to reduce the total incident photon flux (e.g., by reducing the aperture or SPAD size). For example, one technique based on experience (which has been generally accepted as a rule of thumb) involves maintaining a low enough photon flux so that only 1-5% of the laser cycles result in a photon being detected by the SPAD. In this case, $r_i \ll 1 \forall i$ and EQ. (3) can be simplified to $p_i \approx r_i$. At this level of attenuation the mean photon counts $N_i$ become proportional to the incident waveform $r_i$ which can be represented as:

$$\mathbb{E}_{=[N_i]}=Np_i \approx Nr_i$$

This is sometimes referred to as the linear operation regime because the measured histogram $(N_1, N_2, \ldots, N_B)$ is, on average, a scaled version of the true incident waveform $(r_1, r_2, \ldots, r_B)$. This is similar to the case of no ambient light as discussed above, where depths can be estimated by locating the histogram bin with the highest photon counts.

Although lowering the overall photon flux to operate in the linear regime reduces ambient light and prevents pile up distortion, unfortunately, it also reduces the source signal considerably. On the other hand, if the incident photon flux is allowed to remain high, the histogram suffers from pile-up distortion, which can cause amplification of noise during procedures such as Coates correction. As described above, one of the most straightforward approaches to this tradeoff has been to severely restrict the amount of incident flux (sometimes referred to as extreme attenuation) such that the system operates in the linear regime. However, this approach was based on practical experience, and without theoretical tools to evaluate the performance of SPAD-based LiDAR in the linear regime to other approaches it was unclear whether this maximized performance or merely resulted in performance that was good enough to be useful.

The original incident waveform (before any attenuation) can be modeled as a constant ambient light level $\Phi_{bkg}$, with a single source light pulse of height $\Phi_{sig}$. For the purposes of the following discussion, it is assumed that the incident waveform can only be modified by attenuating it with a scale factor $Y \leq 1$. Note that the attenuation factor Y can be understood, in the context of neural density filter, as the fractional transmittance $I/I_0$ of the filter where I is the intensity of light exiting the filter, and $I_0$ is the intensity of light incident on the filter. However, similar attenuation results can be achieved using other techniques. For example, a diaphragm can reduce the total amount of light that reaches the detector. In a more particular example, by reducing the diameter of the aperture of the diaphragm by a factor of $1/\sqrt{2}$ can reduce the amount of light incident on the detector by half. As yet another example, reducing the quantum efficiency of a single photon detector by half, or reducing the size of the single photon detect by half, can be equivalent to adding a neutral density filter with a 50% fractional transmittance. In such an example, an image sensor that includes multiple detectors with different properties can be used to detect incoming light, and the attenuation factor can be controlled by using data from the detector with the selected attenuation factor. Note that attenuation can be provided by a combination of elements, such as a combination of a liquid crystal neutral density filter with a controllable fractional transmittance and a diaphragm with a controllable aperture size. Note that attenuation factor can also be described as being equivalent to a neutral density filter of a particular optical density (e.g., an attenuation factor of 0.01 can provide an equivalent amount of attenuation as a neutral density filter with an density of 2, and attenuation factor of 0.5 can provide an equivalent amount of attenuation as a neutral density filter with an density of 0.3).

This attenuates both the ambient $\Phi_{bkg}$ component and source $\Phi_{sig}$ component proportionally. Note that it is possible to selectively attenuate only the ambient component, to a limited extent, via spectral filtering using a bandpass filter centered on the wavelength emitted by the light source. For the purposes of this discussion, it is assumed that the ambient level $\Phi_{bkg}$ is already at the minimum level that is achievable by spectral filtering. Given a $\Phi_{bkg}$ and $\Phi_{sig}$, the total photon flux incident on the SPAD can be determined by the factor Y. Therefore, the problem of finding the optimal total incident flux can be posed as determining an attenuation Y that results in the greatest depth precision.

The bin receptivity coefficient can represent the probability of detecting a photon in a particular bin in each cycle, and the bin receptivity coefficient $C_i$ of the $i^{th}$ histogram bin can be represented as:

$$C_i = \frac{p_i}{r_i} r, \quad (7)$$

where $p_i$ is the probability of detecting a photon given by EQ. (3), and $r_i$ is the average number of incident photons given by EQ. (2) in the $i^{th}$ bin. In Eq. 7 r can represent the total incident flux as $r = \sum_{i=1}^{B} r_i = Y(\Phi_{bkg} + \Phi_{sig})$.

A bin receptivity curve (BRC) can be defined as the plot of the bin receptivity coefficients $C_i$ as a function of the bin index i. The BRC can be a useful relatively intuitive tool that can be used to evaluate the performance of a SPAD-based LiDAR systems, as it can capture the pile-up vs. shot noise tradeoff. The first term of the bin receptivity coefficient $p_i/r_i$ can quantify the distortion in the shape of the measured histogram with respect to the ideal incident waveform, while the second term r can quantify the strength of the signal. The BRCs shown in FIG. 5A include a BRC for high flux (e.g., achieved using no attenuation, corresponding to an Y=1), a BRC for low flux (e.g., achieved using high or extreme attenuation, corresponding to an Y on the order of 0.0001 to 0.005). As shown in FIG. 5A, for small Y (corresponding to low flux), the BRC is uniform (negligible pile-up, as $p_i/r_i \approx 1$ is approximately constant across i), but the area under the curve is small (low signal). For large Y (corresponding to high flux), the curve's values are large on average (large signal), but skewed towards earlier bins (strong pile-up, as $p_i/r_i$ varies considerably between earlier bins where the ratio is approximately 1 to later bins where the ratio is much ≪1). From these two BRCs it can inferred that as flux increases larger variation in $p_i/r_i$ can be expected across bins i.

Assuming total background flux $B\Phi_{bkg}$ over the entire laser period to be considerably stronger than the total source flux (i.e., $\Phi_{sig} \ll B\Phi_{bkg}$), the flux incident in the $i^{th}$ time bin can be approximated as $r_i \approx r/B$. Then, using EQS. (7) and (3), the BRC can be expressed as:

$$C_i = B\left(1 - e^{-\frac{r}{B}}\right) e^{-(i-1)\frac{r}{B}}, \quad (8)$$

Since total incident flux $r = Y(\Phi_{sig} B\Phi_{bkg})$, and it is assumed that $\Phi_{sig} \ll B\Phi_{bkg}$, r can be approximated as $r \approx YB\Phi_{bkg}$. Substituting in EQ. (8), BRC cab be expressed as a function of only the attenuation Y, for a given number of bins B and a background flux $\Phi_{bkg}$ as follows:

$$C_i(Y) = B(1 - e^{-Y\Phi_{bkg}}) e^{-(i-1)Y\Phi_{bkg}}, \quad (9)$$

In some embodiments, EQ. (9) can be used to navigate the space of BRCs, and hence, the shot noise vs. pile-up tradeoff, by varying a single parameter: the attenuation factor Y. This in turn, can facilitate a calculation of an optical attenuation factor Y that minimizes the mean depth error of a SPAD-based LiDAR in particular conditions.

In some embodiments, using the analytic depth estimator described above in connection with EQ. (6) to recover depths the optimal Y can be expressed in terms of the BRC as:

$$Y^{opt} = \underset{Y}{\mathrm{argmax}} \underset{i}{\min} C_i(Y) \quad (10)$$

In general, the optical depth estimation performance can be achieved, given a signal and background flux, when the minimum bin receptivity coefficient (i.e., the global minimum of the BRC) is maximized. For example, the BRCs for no attenuation and extreme attenuation shown in FIG. 5A both have a global minimum equal to about 0, whereas the BRC corresponding to the optimum attenuation has a global minimum that is substantially higher than 0. This result can be intuitively understood in terms of the space of shapes of the BRC. Maximizing the minimum bin receptivity coefficient can simultaneously strike a balance between two competing goals of making the BRC higher (large signal level), and also, more uniform (low pile-up distortion).

Note that for a fixed Y, the smallest receptivity value is attained at the last histogram bin i=B, (i.e., $\min_i C_i(Y) = C_B(Y)$), which can be inferred from EQ. (9). This can be used to somewhat simplify EQ. (10), which can be represented as:

$$Y^{opt} = \underset{Y}{\mathrm{argmax}} C_B(Y)$$

Further, replacing $C_B(Y)$ with the EQ. (9) and solving for Y, the optimal attenuation for a given ambient flux intensity can be represented as:

$$Y^{opt} = \frac{1}{\Phi_{bkg}} \log\left(\frac{B}{B-1}\right)$$

If it is assumed that the number of histogram bins B»1, this expression can be further simplified based on the value of $$\log\left(\frac{B}{B-1}\right) \approx \frac{1}{B}.$$

Since B is related to the unambiguous depth range $d_{max}$ as $B = 2d_{max}/c\Delta$, the final optimality condition can be represented as:

$$Y^{opt} = \frac{c\Delta}{2d_{max}\Phi_{bkg}} \quad (11)$$

Optimal Flux Attenuation Factor

As described above, FIGS. 5A and 5B show the effect of three different attenuation levels on the BRC of a SPAD exposed to high ambient flux. When no attenuation is used, the BRC decays rapidly due to strong pile-up. Conventional rule of thumb approaches that use extreme attenuation make the BRC approximately uniform across all histogram bins, but very low on average, resulting in extremely low signal. However, using an optimal attenuation factor (e.g., derived using EQ. (10)), the curve exhibits some degree of pile-up, albeit much lower distortion than the case of no attenuation, but considerably higher values, on average, compared to extreme attenuation.

Figure 5:
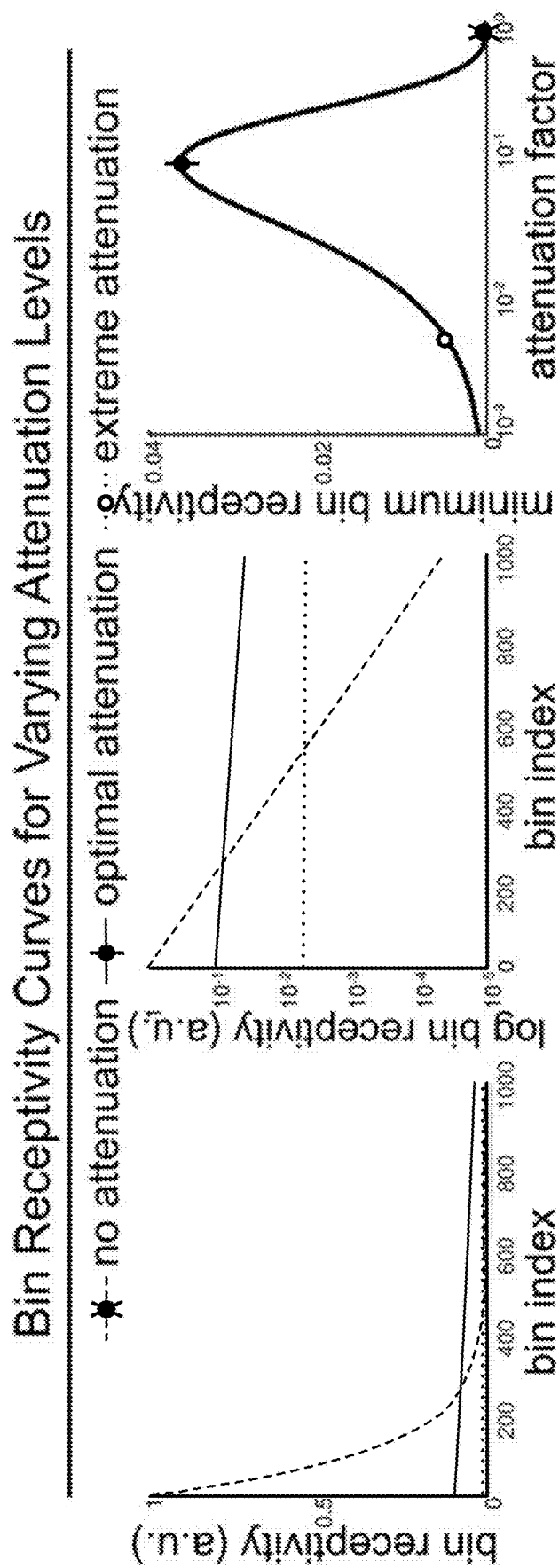
FIG. 5A shows an example of bin receptivity curves for various attenuation levels and a particular ambient light intensity.
FIG. 5B shows an example of log-scale bin receptivity curves for the various attenuation levels and the particular ambient light intensity.
FIG. 5C shows an example of the value of the minimum bin receptivity coefficient as a function of attenuation factor for the particular ambient light intensity.

FIG. 5C shows an example of the value of the minimum bin receptivity coefficient as a function of attenuation factor for the particular ambient light intensity. As shown in FIG. 5 the optimal attenuation factor corresponds to the unique maxima location of the minimum value of BRC.

These concepts can be further illustrated via a particular example based on a SPAD-based LiDAR system with an unambiguous depth range of 100 meters (m) and a histogram bin resolution of $\Delta=100$ picoseconds (ps). In such a system, using the 1% rule of thumb would result in extreme attenuation such that each bin receives approximately $1.5 \times 10^{-6}$ photons (ambient and signal) on average. In contrast, using an optimal attenuation factor (e.g., determined using EQ. (10)) requires that, on average, one background photon should be incident on the SPAD, for each laser cycle. This translates into approximately $1.5 \times 10^{-4}$ photons per bin on average, which is orders of magnitude higher than extreme attenuation, and, results in considerably larger signal and signal to noise ratio. In some embodiments, the time between pulses by the light source can depend on the unambiguous depth range of the system and the dead time of the detectors. For example, for a range of 100 m the maximum round trip length is 200 m which corresponds to the distance light travels in about 666.7 nanoseconds (ns). In such an example, each cycle can be at least 666.7 ns plus the dead time of the sensor to account for photons that are received in one of the time bins representing distances near the maximum depth. In some embodiments, the number of bins can satisfy the relationship $B\Delta \geq d_{max}/2c$. In the preceding example, for a range of 100 m and a bin resolution $\Delta=100$ ps would require at least 1667 bins.

As described above, the optimal attenuation factor as described herein is quasi-invariant to scene depths, number of cycles, and the signal strength $\Phi_{sig}$ (under the assumption that $\Phi_{sig} \ll B\Phi_{bkg}$). This leads to the conclusion that, given a fixed bin-size $\Delta$, $Y^{opt}$ depends only on the ambient flux strength $\Phi_{bkg}$, and the unambiguous depth range $d_{max}$. Accordingly, if $d_{max}$ and $\Phi_{bkg}$ are known, $Y^{opt}$ can be computed, and optimal depth estimation performance can be achieved by attenuating the incident flux (e.g., by varying the aperture or the quantum sensitivity of the SPAD, using a neutral density filter, etc.) accordingly, without having advance knowledge of scene depths. Note that although $Y^{opt}$ is independent of $\Phi_{sig}$ and N, the depth estimation error generally depends on both.

In general, the ambient flux level $\Phi_{bkg}$ is an unknown (however, an expected range of ambient flux values can be estimated based on data collected in environments in which the LiDAR system can be expected to operate) and potentially varies across a scene due to distance and albedo variations. As described below in connection with FIG. 6, for each scene point being measured the ambient flux can be estimated using any suitable technique, such as by capturing data over a set of initial cycles with the source light off (i.e., measuring only the ambient portion of the flux in these initial cycles), and then setting the attenuation based on the estimate of the ambient flux.

Figure 6:
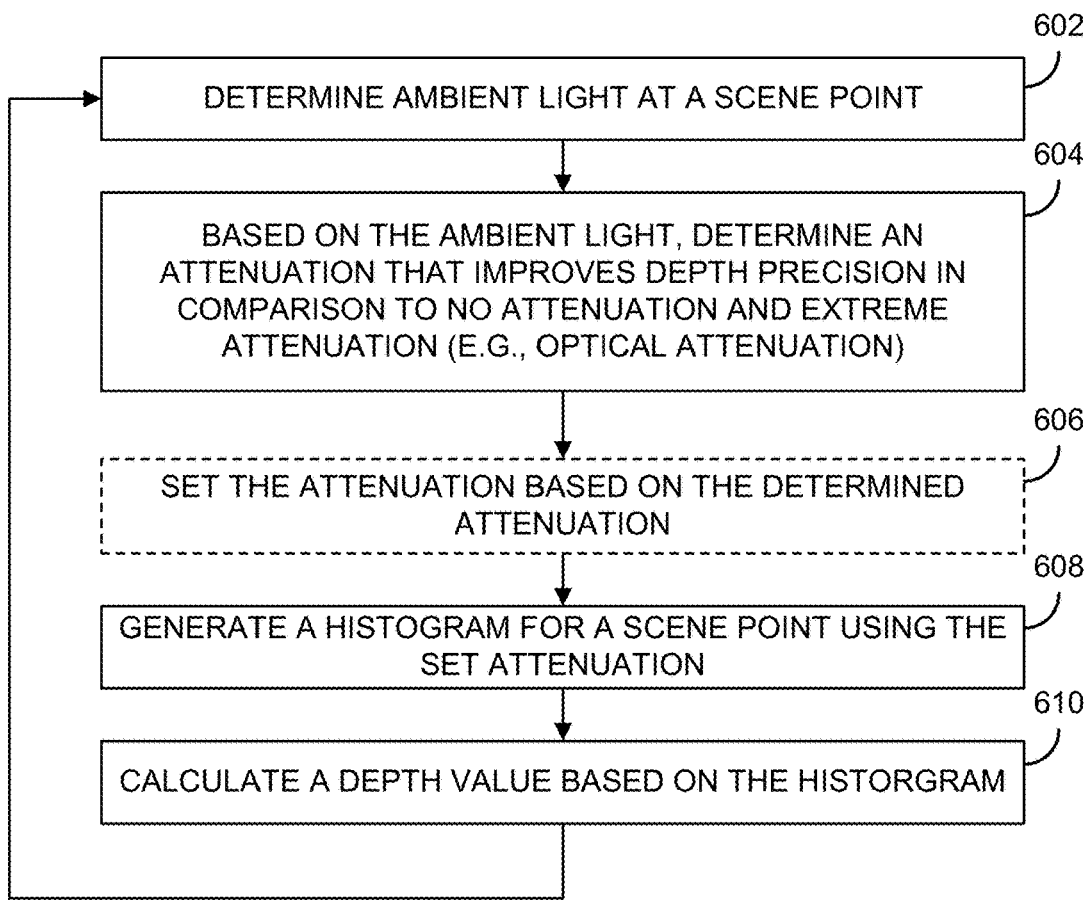
FIG. 6 shows an example 600 of a process for improving the depth precision in ambient light conditions of a single photon depth imaging system in accordance with some embodiments of the disclosed subject matter.

FIG. 6 shows an example 600 of a process for improving the depth precision in ambient light conditions of a single photon depth imaging system in accordance with some embodiments of the disclosed subject matter. At 602, pro- (i.e., $\hat{\tau} = \underset{1 \leq i \leq B}{\mathrm{argmax}} \hat{r}_i$), cess 600 can determine the ambient flux intensity at a scene point using any suitable technique or combination of techniques.

For example, process 600 can capture data over a period of time (e.g., equal in time to a particular number of light source cycles) at a particular scene point with the light source inactive. In such an example, process 600 can estimate the ambient flux at the scene point based on the distribution of photon detections within the period of time, and based on the current attenuation. In such an example, the attenuation factor E can be set to 1. In a more particular example, process 600 can collect data over N' laser cycles with the laser power set to zero, and can generate a histogram of photon counts ($N'_1, N'_2, \ldots, N'_B$) over the N' cycles (note that N' can be any suitable number of cycles, for example 20 to 30 cycles can be enough to determine the background flux relatively accurately). In such an example, the background flux $\Phi_{bkg}$ can be estimated using the following expression:

$$\hat{\Phi}_{bkg} = \ln \frac{\left(\frac{\sum_{i=1}^{B} iN'_i + BN'_{B+1}}{\sum_{i=1}^{B} iN'_i - N'}\right)}{\Upsilon_{cal}}$$

where $\Upsilon_{cal}$ is the attenuation factor applied during the determination of the background flux. In some embodiments, $\Upsilon_{cal}$ can be 1 such that the background flux $\Phi_{bkg}$ is determined based on the maximum transmittance of the system. However, this is merely an example, and other values of attenuation can be used while determining the background flux. For example, if $\Upsilon_{cal}$ is 0.5, then the estimated background flux can be adjusted to account for the current attenuation factor. For example, in some embodiments, data captured at 602 can use the attenuation factor determined for a previous scene point while determining the flux, which can in some cases require less adjustments to the attenuation factor as scene points in close proximity in space may have similar background flux.

As yet another example, process 600 can collect data over a period of time using one or more conventional detectors (e.g., CMOS or CCD-based pixels), and the background flux can be estimated based the brightness value recorded by the conventional detector(s). In such an example, the value generated by the conventional detector can be converted to a photon flux based on the gain provided by the pixel. Such a conversion can be determined during a calibration of the system and programmed (e.g., hard-coded) into the system. In some embodiments, the period of time can be on the order of tens to hundreds of microseconds. For example, the exposure time of the conventional detector can be in the range of 30 to 100 microseconds, and the flux detected during that exposure time can be used to determine the background flux at a particular scene point.

At 604, process 600 can determine an attenuation factor that is expected to improve the depth precision. For example, in some embodiments, process 600 can calculate the optimal attenuation $\tau^{opt}$. In such an example, the optimal attenuation can be determined based on the number of time bins B and the estimated ambient flux $\hat{\Phi}_{bkg}$. In a more particular example, process 600 can determine the optimal attenuation that is expected to minimize the depth error at the current scene point based on the following relationship:

$$\Upsilon^{opt} = \frac{1}{B\hat{\Phi}_{bkg}}$$

As another example, process 600 can calculate an attenuation from a predetermined set of attenuation factors that is expected to increase the depth precision of the system. In such an example, a LiDAR system may be configured with a predetermined number of particular attenuation levels that the system can utilize when generating data. In a more particular example, process 600 can determine which of the particular attenuation levels to set based on the optimal attenuation $\Upsilon^{opt}$. As described below, for example in connection with FIGS. 7A1 to 7A3, although there is specific optimal attenuation value that can be calculated, relative depth error is generally relatively flat around the optimal level in many cases. Accordingly, if the LiDAR system is configured with eight predetermined attenuation levels (e.g., $\Upsilon=\{0.5, 0.2, 0.1, 0.05, 0.02, 0.01, 0.005, 0.002\}$, which can be described using equivalent optical densities of roughly $OD=\{0.3, 0.6, 1.0, 1.3, 1.6, 2.0, 2.3, 2.6\}$), process 600 can determine the optimal attenuation, and can select the predetermined value that is closest to the optimal value.

As yet another example, process 600 can include calculating an average expected background flux value that a LiDAR system is expected to encounter in the environment in which it operates and/or a distribution of background flux values. In such an example, process 600 can calculate an attenuation value that is expected to minimize average depth errors given the average expected background flux. In a more particular example, a LiDAR system for an autonomous vehicle can be expected to operate in a range of conditions, from bright sunlight to relatively dark conditions at night. In this example, the average daytime background flux that the autonomous vehicle is expected to encounter can be determined (e.g., by operating a LiDAR system with source power set to zero while the vehicle is operated) and/or the average nighttime background flux. Process 600 can include calculating an attenuation factor that will minimize depth errors over an expected range of background flux in which the autonomous vehicle is expected to operate. In such an example, a LiDAR system can be implemented with a fixed attenuation, or multiple fixed attenuations that are expected to minimize average depth errors.

At 606, process 600 can set an attenuation to be used when recording data based on the attenuation level determined at 604. For example, process 600 can cause a variable attenuation element (e.g., a diaphragm, a liquid crystal shutter, an attenuation wheel, a quantum efficiency of a SPAD, etc.) to be set to the value determined at 604. As described above in connection with 604, setting the attenuation may be done on a global basis prior to capturing data, and may not be performed for every scene point. For example, if the LiDAR is equipped with a fixed attenuator (e.g., based on an attenuation factor that is expected to minimize average depth errors), 606 can be performed once while the LiDAR is being designed or installed. As another example, if the LiDAR is equipped with multiple detectors associated with different attenuations, the attenuation factor for each detector may be fixed, and rather than setting an attenuation(s) at 606, process 600 can record data using each detector, and can select which data to use based on the attenuation determined at 604. In such examples, 606 can be omitted.

At 608, process 600 can generate a histogram for a scene point using data that is recorded using the set attenuation factor. In some embodiments, the histogram generation procedure can be carried out using the same techniques used by conventional SPAD-based LiDAR. For example, as described above in connection with FIGS. 2A1 to 2B3, the arrival time of the first photon in each cycle can be recorded, and the arrival times can be collected into B time bins to generate a histogram of arrival times.

At 610, process 600 can calculate a depth value for the scene point based on the histogram generated at 608. In some embodiments, process 600 can use any suitable technique or combination of techniques to determine the depth value of the scene point. For example, as described above in connection with FIGS. 3A1 to 3C3, process 600 can use Coates's estimator. As another example, as described below in connection with FIGS. 8A and 8B, process 600 can use machine learning techniques to estimate the depth at each scene point. Additional examples and techniques for estimating a depth value based on SPAD-based LiDAR histogram information are described in Appendix A.

FIGS. 7A1 to 7A3 show examples of simulated relative depth errors for various light source signal intensities in the presence of ambient light at a first (low) intensity, a second intensity, and a third (highest), respectively, intensity as a function of attenuation factor. More particularly, FIG. 7A1 corresponds to a background flux of $\Phi_{bkg}=0.02$ photons per bin (which roughly corresponds to twilight during sunrise or sunset), FIG. 7A2 corresponds to a background flux of $\Phi_{bkg}=0.06$ (roughly corresponding to an overcast day), and FIG. 7A3 corresponds to a background flux of $\Phi_{bkg}=0.20$ (roughly corresponding to full daylight). In each of FIGS. 7A1 to 7A3, the leftmost vertical dashed line corresponds to the attenuation factor that would result in extreme attenuation (in this case an expected photon detection rate of one detection out of every 100 cycles, or 1%, such that the effective flux was about $5\times10^{-3}$). The middle vertical dashed line corresponds to the "optimal attenuation" factor for the given background flux. For example, for FIG. 7A1, 1,000 time bins were used in the simulation (i.e., B=1,000), the optimal attenuation can be calculated as $$Y^{opt} = \frac{1}{B\hat{\Phi}_{bkg}} = \frac{1}{1,000*0.02} = 0.05.$$

The right vertical dashed line corresponds to no attenuation. In this example, no attenuation corresponds to no additional neutral density attenuation beyond attenuation outside of the source band via spectral filtering. Note that background flux in a particular environment can depend on the properties of the detector and LiDAR system being used. For example, a LiDAR system can be implemented using a 532 nm (green) laser with a narrow bandpass spectral filter disposed between a SPAD detector and the scene to reject all other wavelengths of light. In such an example, the narrow bandpass filter can have a 2 nm width (e.g., +/−1 nm around 532 nm). Note this is a relatively idealized filter for the sake of explanation, and many commercially available filters have a larger width on the order of 5 to 10 nm. The number of ambient light photons that can be expected to be incident on the SPAD detector without providing additional attenuation (e.g., with an attenuation factor Y=1) can be calculated in various environments based on the measured brightness, such as the brightness when operating outdoors on a bright sunny day. Using solar irradiance data from the ASTM G173 standard that lists values in watts per square meter per nanometer incident on a surface on the earth that is tilted at 37° to the horizontal, the values of interests at 531, 532 and 533 nm are 1.6291, 1.5998 and 1.4286 W/m²/nm. Computing the area under the curve (using trapezoidal integration) the energy flux can be calculated as 3.13 W/m² in the 2 nm band around 532 nm. Assuming that all of this energy is focused on the photo-sensitive area of a square SPAD detector of size 25×25 microns, the photon power incident on this area is equal to $1.955\times10^{-9}$ watts. Watts can be converted to photon flux in photons per second given that each 532 nm photon is essentially an "energy packet" with h×c/532e-9 joules of energy, and 1 watt is 1 joule per second (where h is the Planck's constant and c=3e8 m/s, the speed of light). This yields a photon flux of ~5e9 photons per second in full sunlight. Assuming a bin size of 100 picoseconds, this corresponds to $\Phi_{bkg}=0.5$ photons/bin. Using this same procedure, the flux at other daylight intensity conditions can be estimated. Note that a bright sunny day is 100,000 lux. Accordingly, the maximum intensity in the shade on a bright sunny day (e.g., about 20,000 lux) can be estimated to have a background intensity of about $\Phi_{bkg}=0.1$ photons/bin, while an overcast day (e.g., about 2,000 lux) can be estimated to have a background intensity of about $\Phi_{bkg}=0.01$ photons/bin, and a moonlit clear night sky (e.g., about 1 lux) can be estimated to have a background intensity of about $\Phi_{bkg}=5e-6$ photons/bin.

FIGS. 7B1 to 7B3 show examples of simulated relative depth errors for various ambient light intensities and a first source signal intensity, a second signal intensity, and a third signal intensity, respectively, as a function of attenuation factor. More particularly, FIG. 7B1 corresponds to a signal intensity of $\Phi_{sig}=1$ photons per bin, FIG. 7B2 corresponds to a signal intensity of $\Phi_{sig}=3$, and FIG. 7B3 corresponds to a signal intensity of $\Phi_{sig}=10$. Each line corresponds to a different background intensity, and the asterisk set of with vertical dashes corresponds to the optimal attenuation calculated for each value of background intensity $\Phi_{bkg}$.

The simulation results shown in FIGS. 7A1 to 7B3 were generated based on Monte Carlo simulations, and demonstrate the effect of varying attenuation factors on the mean depth estimation error. A uniform depth distribution was assumed over a range of 1,000 time bins (i.e., B=1,000). The estimation used discrete delta waveforms described above in connection with EQ. (2). Coates's estimator (e.g., as described above in connection with FIGS. 3A1 to 3C3) was used to estimate depths. FIGS. 7A1 to 7B3 are plots of the relative root-mean-squared errors (RMSE) as a function of attenuation factor Y, for a wide range of ambient $\Phi_{bkg}$ and signal $\Phi_{sig}$ values.

As shown in FIGS. 7A1 to 7A3, the optimal attenuation $Y^{opt}$ predicted using EQ. (11), as illustrated by the middle dashed vertical line, coincided with the locations of the valleys (minimum depth error) of the illustrated error plots. As described in more detail in Appendix A, the secondary dips in the error plots at high flux levels are an artifact caused by Coates's estimator, and more sophisticated estimators such as MAP can reduce such artifacts. Additionally, as can be observed in FIGS. 7A1 to 7A3, the optimal attenuation is quasi-independent of the signal flux $\Phi_{sig}$, as predicted by EQ. (11). As shown in FIGS. 7B1 to 7B3, the predicted optimal attenuation aligns well with the valleys of respective lines, and as expected from EQ. (11) the optimal attenuation is different for different lines (which represent different ambient flux levels).

As shown in FIGS. 7A1 to 7B3, the optimal attenuation criterion described herein can achieve improvement in depth estimation error by an order of magnitude as compared to extreme or no attenuation. Since most valleys are relatively flat, in general, the mechanisms described herein are robust to uncertainties in the estimated background flux, and thus, can achieve high depth precision across a wide range of illumination conditions.

Figure 8A:
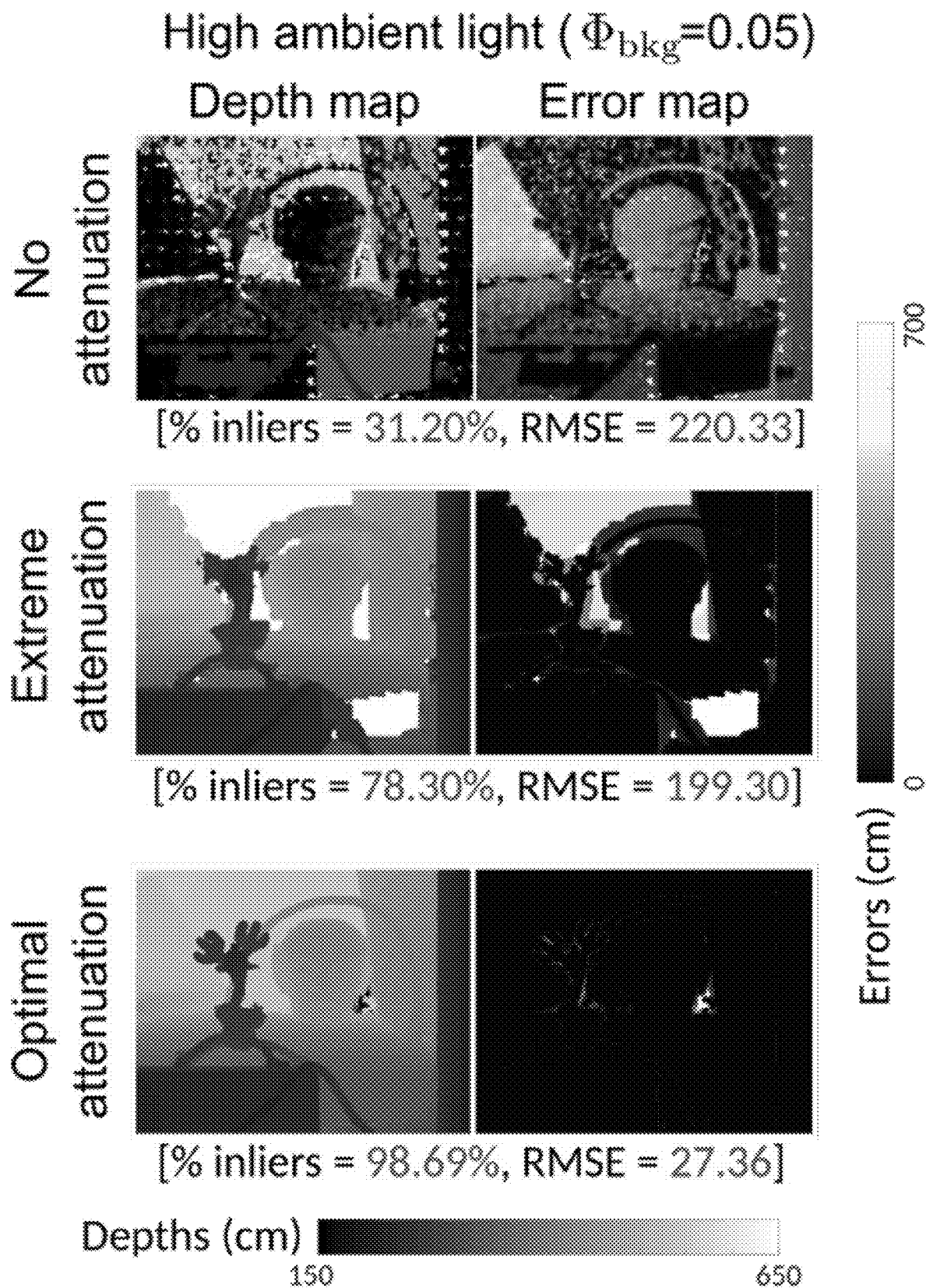
FIG. 8A shows examples of simulated depth maps generated using a neural network-based depth estimation technique and corresponding error maps at various attenuation levels in the presence of high ambient light intensity, including an attenuation factor ("optimal attenuation") adaptively determined across different scene points in accordance with some embodiments of the disclosed subject matter.
Figure 8B:
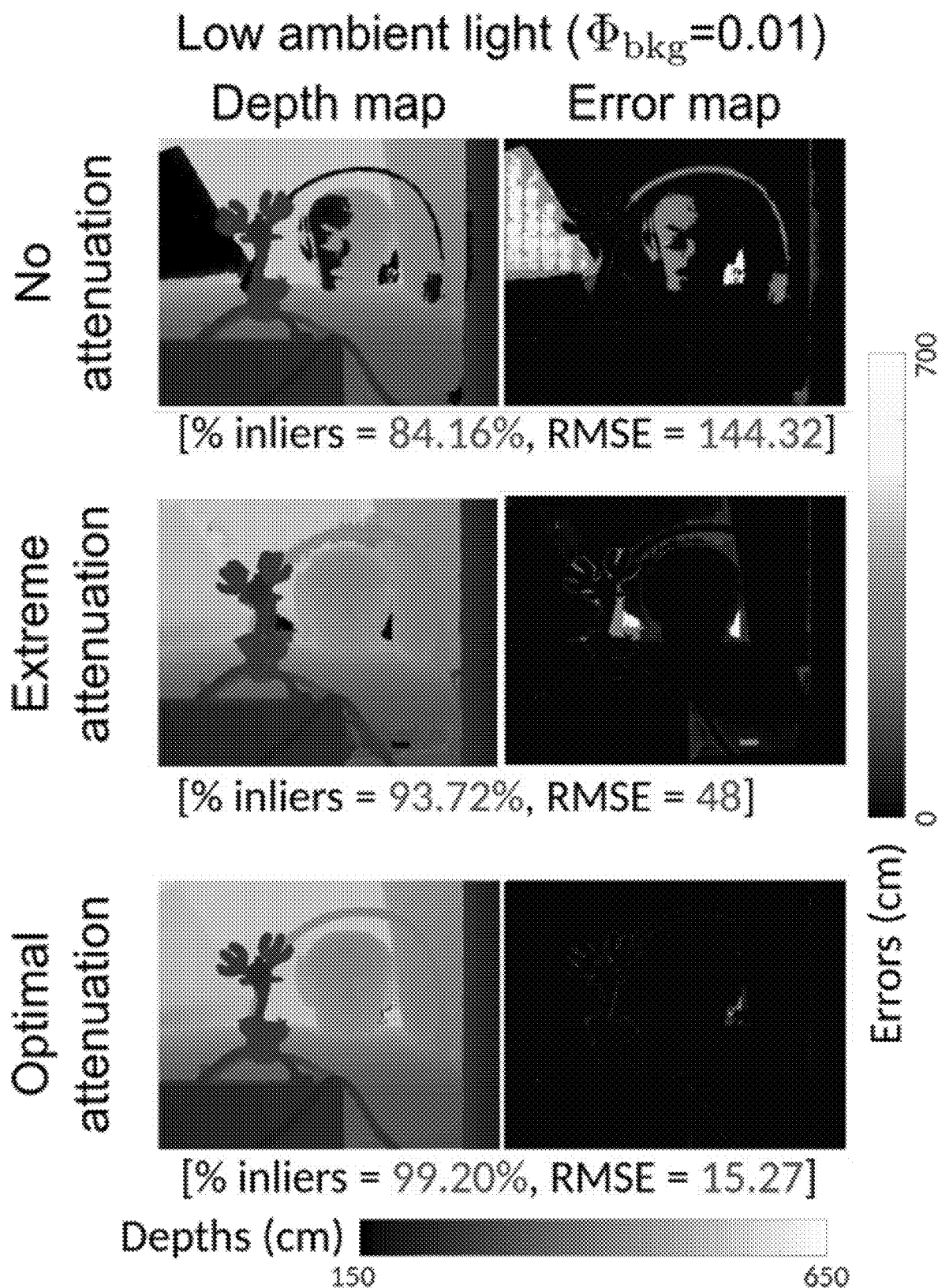
FIG. 8B shows examples of simulated depth maps generated using a neural network-based depth estimation technique and corresponding error maps at various attenuation levels in the presence of low ambient light intensity, including an attenuation factor ("optimal attenuation") determined in accordance with some embodiments of the disclosed subject matter.

FIGS. 8A and 8B show examples of simulated depth maps generated using a neural network-based depth estimation technique and corresponding error maps at various attenuation levels in the presence of high ambient light intensity (i.e., $\Phi_{bkg}$=0.05) and low ambient intensity (i.e., $\Phi_{bkg}$=0.01), respectively, including an attenuation factor ("optimal attenuation") adaptively determined across different scene points in accordance with some embodiments of the disclosed subject matter. Note that although the optimal attenuation is described herein in connection with an analytic pixel-wise depth estimator (i.e., Coates's estimator), in practice, it is valid for other estimators, such as deep neural network (DNN) based techniques that exploit spatio-temporal correlations in natural scenes. The results shown in FIGS. 8A and 8B were generated based on a convolutional DNN (a network described in Lindell et al., "Single-photon 3D imaging with deep sensor fusion," ACM Transactions on Graphics, 37(4) (2018), which is hereby incorporated by reference herein in its entirety) that was trained using simulated pile-up corrupted histograms, generated using ground truth depth maps from the NYU depth dataset V2 (described in Silberman et al., "Indoor segmentation and support inference from rgnd images," European Conference on Computer Vision (2012), which is hereby incorporated by reference herein in its entirety). The trained network was tested on the Middlebury dataset (described in Scharstein et al., "Learning conditional random fields for stereo." IEEE Conference on Computer Vision and Pattern Recognition, pages 1-8 (2007), which is hereby incorporated by reference herein in its entirety). For each combination of ambient flux, source flux and attenuation factor, a separate instance of the DNN was trained on corresponding training data, and tested on corresponding test data to ensure a fairer comparison across the different attenuation methods.

As shown in FIGS. 8A and 8B, if no attenuation was used with high ambient light, the acquired data is severely distorted by pile up, resulting in large depth errors. With extreme attenuation, the DNN is able to smooth out the effects of shot noise, but results in blocky edges. With optimal attenuation calculated as described herein, the trained DNN successfully recovered the depth map with considerably higher accuracy, at all ambient light levels. Accordingly, FIGS. 8A and 8B demonstrate that the mechanisms described herein can improve depth precision of depth values calculated by more sophisticated estimators.

FIGS. 9A1 to 9A3 show examples of observed relative depth errors for various light source signal intensities in the presence of ambient light at a first (low) intensity, a second intensity, and a third (highest), respectively, intensity as a function of attenuation factor.

FIGS. 9B1 to 9B3 show examples of observed relative depth errors for various ambient light intensities and a first source signal intensity, a second signal intensity, and a third signal intensity, respectively, as a function of attenuation factor.

The results shown in FIGS. 9A1 to 9B3 were generated using a SPAD-based LiDAR system that was similar to the schematic shown in FIG. 1. The system incorporated a 405 nm wavelength, pulsed, picosecond laser (an LDH P-C-405B model laser available from PicoQuant with headquarters in Berlin, Germany) and a co-located fast-gated single-pixel SPAD detector with a 200 ns dead time (an example of a similar detector is described in Buttafava et al., "Time-gated single-photon detection module with 110 ps transition time and up to 80 mhz repetition rate," Review of Scientific Instruments, 85(8):083114 (2014), which is hereby incorporated by reference herein in its entirety). The laser repetition frequency was set to 5 MHz providing an unambiguous depth range of 30 meters. Photon timestamps were acquired using a TCSPC module (a HydraHarp 400 model available from PicoQuant). Due to practical space constraints, various depths covering the full 30 m of unambiguous depth range were emulated using a programmable de-layer module (a Picosecond Delayer Module (PSD) available from Micro Photon Devices with headquarters in Bolzano, Italy).

Note that the curves shown in FIGS. 9A1 to 9A3 follow the same trends observed in the simulated plots of FIGS. 7A1 to 7B3, and provide experimental support for the improvement in depth precision that can be achieved using mechanisms described herein to determine an attenuation factor in the presence of non-idealities such as jitter and after-pulsing effects, and for a non-delta waveform.

FIG. 10A shows an example of a scene including a mannequin face that was imaged using a SPAD-based pulsed LiDAR system with different attenuation factors in the presence of ambient light at a high intensity, including an attenuation factor ("optimal attenuation") determined in accordance with some embodiments of the disclosed subject matter.

FIG. 10B shows an example of histograms representing a point on the scene of FIG. 10A in the presence of ambient light at a high intensity generated using different attenuation factors.

FIGS. 10C1 to 10C3 show examples of surfaces generated from depth information generated by a SPAD-based pulsed LiDAR system with no attenuation, extreme attenuation, and an attenuation determined for the scene in accordance with some embodiments of the disclosed subject matter, respectively. As shown in FIGS. 10C1 to 10C3, the depth error was much lower when using the attenuation factor determined using mechanisms described herein (i.e., an attenuation factor of $Y=1/7 \approx 0.14$) than for extreme attenuation (i.e., an attenuation factor of $Y=1/140$). The 3D reconstruction results of the object in the scene of FIG. 10A were generated from data recorded with varying attenuation levels, and were acquired by raster-scanning the laser spot with a two-axis galvo-mirror system (a GVS-012 model from Thorlabs with headquarters in Newton, NJ). As shown in the histograms of FIG. 10B, extreme attenuation almost completely removed pile-up, but also reduced the signal to a very low level. In contrast, optimal attenuation resulted in some residual pile-up, and yet, achieved approximately an order of magnitude higher depth precision as compared to extreme and no attenuation.

FIG. 11A1 shows an example of a scene including a model of a building that was imaged using a SPAD-based pulsed LiDAR system with different attenuation factors in the presence of ambient light at a moderate intensity (e.g., roughly 15,000 lux), including an attenuation factor ("optimal attenuation") determined in accordance with some embodiments of the disclosed subject matter.

FIGS. 11A2 to 11A4 show examples of depth maps representing depth information generated by a SPAD-based pulsed LiDAR system with no attenuation, extreme attenuation, and optimal attenuation, respectively, determined by filtering Coates-corrected count values to select a bin corresponding to the scene depth at each point. In some embodiments, estimating the scene depth can include additional processing applied to the Coates-corrected count values. For example, a matched filter can be applied to the Coates-corrected values, which can include a sliding window correlation operation with the pulse shape emitted by the light source used as a matching template. In such an example, the bin where the template most closely matches the Coates-corrected waveform can be used to estimate the depth.

FIG. 11B1 shows an example of a scene with a wide range of illumination levels, albedo variations, and multiple objects over a relatively wide depth range that was imaged using a SPAD-based pulsed LiDAR system with different attenuation factors in the presence of ambient light having an intensity that varies over the scene illuminated by a light source having moderate intensity (e.g., roughly 15,000 lux), including an attenuation factor ("adaptive attenuation") determined on a per-location basis in accordance with some embodiments of the disclosed subject matter and selected from a discrete number of attenuation levels (in this case two discrete values).

FIGS. 11B2 and 11B2 show an example of a depth map representing depth information generated by a SPAD-based pulsed LiDAR system with extreme attenuation, and an attenuation determined in accordance with some embodiments of the disclosed subject matter, respectively, determined by filtering Coates-corrected count values to select a bin corresponding to the scene depth at each point. FIG. 11B4 shows an example of an attenuation map representing the attenuation factor used while generating scene depth information with a SPAD-based pulsed LiDAR system.

As shown in FIGS. 11B2 and 11B3, reconstructed depth maps were generated for the more complex scene shown in FIG. 11B1, which included a wider range of illumination levels, albedo variations, and multiple objects over a wider depth range. As shown in FIG. 11B4, the attenuation factor was adaptively selected for different parts of the scene in direct and indirect ambient light, respectively. FIGS. 11B1 to 11B4 demonstrate that adaptive attenuation levels can be used to reconstruct more accurate depth maps over a wide dynamic range of ambient illumination levels in a single scene.

In some embodiments, any suitable computer readable media can be used for storing instructions for performing the functions and/or processes described herein. For example, in some embodiments, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as RAM, Flash memory, electrically programmable read only memory (EPROM), electrically erasable programmable read only memory (EEPROM), etc.), any suitable media that is not fleeting or devoid of any semblance of permanence during transmission, and/or any suitable tangible media. As another example, transitory computer readable media can include signals on networks, in wires, conductors, optical fibers, circuits, or any suitable media that is fleeting and devoid of any semblance of permanence during transmission, and/or any suitable intangible media.

It should be noted that, as used herein, the term mechanism can encompass hardware, software, firmware, or any suitable combination thereof.

It should be understood that the above described steps of the process of FIG. 6 can be executed or performed in any order or sequence not limited to the order and sequence shown and described in the figures. Also, some of the above steps of the processes of FIG. 6 can be executed or performed substantially simultaneously where appropriate or in parallel to reduce latency and processing times.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims that follow. Features of the disclosed embodiments can be combined and rearranged in various ways.

What is claimed is:

1. A system for determining depths, comprising:
a light source;
a detector configured to detect arrival of individual photons;
an attenuation element configured to provide a variable intensity attenuation factor to remove pile-up of detected photons and decrease an error associated with a calculation of depth,
wherein an intensity of light perceived by the detector corresponds to a product of the attenuation factor and an intensity of light perceived by the detector in the absence of attenuation by the attenuation element; and
a processor that is programmed to:
(a) determine an ambient light intensity associated with a scene point;
(b) calculate an attenuation factor based on the ambient light intensity;
(c) estimate a depth of the scene point based on a multiplicity of photon arrival times determined using the detector during a period of time during which light incident on the detector is attenuated by an attenuation factor selected based on the calculated attenuation factor and during which the light source is configured to periodically emit a pulse of light toward the scene point;
(d) repeat (a) through (c) for each of a multiplicity of scene points.

2. The system of claim 1, wherein the detector comprises a single photon avalanche diode (SPAD).

3. The system of claim 1, wherein the attenuation element comprises a diaphragm with a controllable aperture disposed between the scene point and the detector, and
wherein the attenuation factor varies with a diameter of the aperture.

4. The system of claim 3, wherein the processor is further programmed to:
cause the diameter of the aperture to adjust to a different diameter that provides the selected attenuation factor.

5. The system of claim 1, wherein the attenuation element comprises a plurality of attenuation elements, each of the plurality of attenuation elements having a different attenuation factor.

6. The system of claim 5, wherein one of the plurality of attenuation elements is disposed between the scene point and the detector.

7. The system of claim 5, wherein the calculated attenuation factor is an optimum attenuation factor, and wherein the processor is further programmed to:
select an attenuation element of the plurality of attenuation elements that has an attenuation factor that is closest to the optimum attenuation factor.

8. The system of claim 7, wherein each of the plurality of attenuation elements is associated with one of a plurality of detectors and the selected attenuation element is associated with the detector, and
    wherein the processor is further programmed to:
        estimate the depth of the scene point based on data collected using the detector associated with the selected attenuation element.

9. The system of claim 1, wherein the attenuation element comprises a circuit that provides a bias voltage to the detector to control a quantum efficiency of the detector, and
    wherein the attenuation factor varies with the bias voltage.

10. The system of claim 1, wherein the processor is further programmed to:
    (c1) determine, for an $i^{th}$ time bin of B time bins, a number $N_i$ corresponding to a number of detection events by the detector falling within the $i^{th}$ time bin during N cycles each having a cycle duration,
        wherein each of the multiplicity of photon arrival times is associated with one of the B time bins, and
        wherein each of the N cycles includes:
            (i) the light source emitting a pulse at a first time; and
            (ii) based on a signal output from the detector indicating that a photon was detected at a second time within the cycle duration, determining that an elapsed time between the first time and the second time corresponds to the $i^{th}$ time bin;
    (c2) repeat (c1) for each i from 1 to B; and
    (c3) estimate the depth based on a vector comprising values $(N_1, N_2, \ldots, N_B)$.

11. The system of claim 10, wherein the processor is further programmed to:
    estimate the depth of the scene point by applying a Coates-correction to the vector comprising values $(N_1, N_2, \ldots, N_B)$.

12. The system of claim 1, wherein the processor is further programmed to:
    (a1) determine, for an $i^{th}$ time bin of B time bins, a number N' corresponding to a number of detection events by the detector falling within the $i^{th}$ time bin during N' cycles each having a cycle duration,
        wherein each of the N' cycles includes:
            (i) inhibiting the light source from emitting a pulse at a first time; and
            (ii) based on a signal output from the detector indicating that a photon was detected at a second time within the cycle duration, determining that an elapsed time between the first time and the second time corresponds to the $i^{th}$ time bin;
    (a2) repeat (a1) for each i from 1 to B; and
    (a3) determine the ambient light intensity associated with the scene point based on a vector comprising values $(N_1, N_2, \ldots, N_B)$.

13. A method for determining depths, comprising:
    (a) determining an ambient light intensity associated with a scene point;
    (b) calculating an attenuation factor based on the ambient light intensity;
    (c) estimating a depth of the scene point based on a multiplicity of photon arrival times detected by a detector during a period of time during which light incident on the detector is attenuated by an attenuation element configured to provide the calculated attenuation factor and during which a light source is configured to periodically emit a pulse of light toward the scene point,
        wherein an intensity of light perceived by the detector corresponds to a product of the attenuation factor and an intensity of light perceived by the detector in the absence of attenuation by the attenuation element, and
        wherein the attenuation factor is configured to remove pile-up of detected photons and decrease an error associated with the depth of the scene point; and
        wherein the detector is configured to detect arrival of individual photons;
    (d) repeating (a) through (c) for each of a multiplicity of scene points.

14. The method of claim 13, wherein the detector comprises a single photon avalanche diode (SPAD).

15. The method of claim 13, wherein the attenuation element comprises a diaphragm with a controllable aperture disposed between the scene point and the detector, and
    wherein the attenuation factor varies with a diameter of the aperture.

16. The method of claim 15, further comprising causing the diameter of the aperture to adjust to a different diameter that provides the selected attenuation factor.

17. A non-transitory computer readable medium containing computer executable instructions that, when executed by a processor, cause the processor to perform a method for determining depths, comprising:
    (a) determining an ambient light intensity associated with a scene point;
    (b) calculating an attenuation factor based on the ambient light intensity, which is associated with the scene point;
    (c) estimating a depth of the scene point based on a multiplicity of photon arrival times detected by a detector during a period of time during which light incident on the detector is attenuated by an attenuation element configured to provide the calculated attenuation factor and during which a light source is configured to periodically emit a pulse of light toward the scene point,
        wherein an intensity of light perceived by the detector corresponds to a product of the attenuation factor and an intensity of light perceived by the detector in the absence of attenuation by the attenuation element, and
        wherein the attenuation factor is configured to remove pile-up of detected photons and decrease an error associated with the depth of the scene point; and
        wherein the detector is configured to detect arrival of individual photons;
    (d) repeating (a) through (c) for each of a multiplicity of scene points.

18. The non-transitory computer-readable medium of claim 17, wherein the detector comprises a single photon avalanche diode (SPAD).

19. The non-transitory computer-readable medium of claim 17, wherein the attenuation element comprises a diaphragm with a controllable aperture disposed between the scene point and the detector, and
    wherein the attenuation factor varies with a diameter of the aperture.

20. The non-transitory computer-readable medium of claim 19, wherein the method further comprises causing an aperture of the diaphragm to adjust to a size that provides the selected attenuation factor.

\* \* \* \* \*